(12) United States Patent
Zhan et al.

(10) Patent No.: US 11,145,642 B2
(45) Date of Patent: Oct. 12, 2021

(54) SINGLE-STACK BIPOLAR-BASED ESD PROTECTION DEVICE

(71) Applicant: NXP USA, Inc., Austin, TX (US)

(72) Inventors: Rouying Zhan, Chandler, AZ (US); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 463 days.

(21) Appl. No.: 16/141,607

(22) Filed: Sep. 25, 2018

(65) Prior Publication Data

US 2019/0103396 A1 Apr. 4, 2019

(30) Foreign Application Priority Data

Oct. 3, 2017 (EP) .................................... 17306318

(51) Int. Cl.
| | | |
|---|---|---|
| *H01L 27/02* | (2006.01) | |
| *H01L 29/732* | (2006.01) | |
| *H01L 29/66* | (2006.01) | |
| *H01L 27/12* | (2006.01) | |
| *H01L 29/08* | (2006.01) | |
| *H01L 29/36* | (2006.01) | |
| *H01L 29/06* | (2006.01) | |
| *H01L 29/10* | (2006.01) | |
| *H01L 21/266* | (2006.01) | |
| *H01L 21/027* | (2006.01) | |
| *H01L 21/265* | (2006.01) | |
| *H01L 29/167* | (2006.01) | |
| *H01L 21/02* | (2006.01) | |
| *H01L 21/762* | (2006.01) | |

(52) U.S. Cl.
CPC ...... *H01L 27/0262* (2013.01); *H01L 27/0259* (2013.01); *H01L 27/1203* (2013.01); *H01L 29/0692* (2013.01); *H01L 29/0804* (2013.01); *H01L 29/0821* (2013.01); *H01L 29/1004* (2013.01); *H01L 29/36* (2013.01); *H01L 29/66272* (2013.01); *H01L 29/732* (2013.01); *H01L 21/0273* (2013.01); *H01L 21/02532* (2013.01); *H01L 21/02579* (2013.01); *H01L 21/266* (2013.01); *H01L 21/26513* (2013.01); *H01L 21/76283* (2013.01); *H01L 29/167* (2013.01)

(58) Field of Classification Search
CPC ............. H01L 27/0262; H01L 27/0259; H01L 27/1203; H01L 29/66272; H01L 29/732
USPC .......................... 257/592; 438/311, 328, 350
See application file for complete search history.

(56) References Cited

U.S. PATENT DOCUMENTS

| | | |
|---|---|---|
| 6,777,784 B1 | 8/2004 | Vaschenko |
| 8,193,560 B2 | 6/2012 | Gendron et al. |
| 8,242,566 B2 | 8/2012 | Zhan et al. |
| 9,019,677 B2 | 4/2015 | Kikuchi |
| 9,129,806 B2 | 9/2015 | Zhan et al. |
| 9,177,952 B2 | 11/2015 | Zhan et al. |
| 9,287,255 B2 | 3/2016 | Zhan et al. |

(Continued)

*Primary Examiner* — Robert T Huber

(57) ABSTRACT

A single-stage voltage clamp device with high holding voltage characteristics (e.g., ~40V) includes two p-n-p structures coupled in series via an n-p-n structure. The device has a low-voltage terminal that may be coupled to the ground of a circuit and high voltage terminal that may be coupled to a voltage source of the circuit. A highly doped floating (n+)/(p+) junction region within a heavily doped base of the low-voltage-side p-n-p structure allows for holding voltages of at least 40V in the single-stage device without the need to employ two such devices in series to achieve the desired holding voltage.

16 Claims, 19 Drawing Sheets

(56) References Cited

U.S. PATENT DOCUMENTS

| | | |
|---|---|---|
| 9,614,369 B2 | 4/2017 | Laine et al. |
| 2009/0195944 A1 | 8/2009 | Goyal et al. |
| 2009/0213506 A1 | 8/2009 | Zhan et al. |
| 2011/0175198 A1 | 7/2011 | Zhan et al. |
| 2011/0176243 A1 | 7/2011 | Zhan et al. |
| 2011/0176244 A1 | 7/2011 | Gendron et al. |
| 2014/0159102 A1 | 6/2014 | Van Wijmeersch et al. |
| 2014/0346560 A1 | 11/2014 | Zhan et al. |
| 2016/0013177 A1 | 1/2016 | Zhan et al. |
| 2016/0276332 A1 | 9/2016 | Laine et al. |
| 2016/0276460 A1 | 9/2016 | Laine et al. |
| 2016/0300828 A1 | 10/2016 | Laine et al. |
| 2017/0005081 A1 | 1/2017 | Laine et al. |
| 2017/0084599 A1 | 3/2017 | Zhan |
| 2017/0098644 A1 | 4/2017 | Hong et al. |
| 2017/0170166 A1 | 6/2017 | Song et al. |

SINGLE-STACK BIPOLAR-BASED ESD PROTECTION DEVICE

CROSS-REFERENCE TO RELATED APPLICATIONS

This application claims the priority under 35 U.S.C. § 119 of European patent application no. 17306318.1, filed Oct. 3, 2017 the contents of which are incorporated by reference herein.

FIELD OF USE

Embodiments of the present disclosure relate generally to electronic devices, and more particularly, to electrostatic discharge (ESD) protection devices and related fabrication methods.

BACKGROUND

Integrated circuits (ICs) and electronic assemblies, and the devices therein, are at risk of damage due to electrostatic discharge (ESD) events. This is well known in the art. During an ESD event, a voltage (or current) may be provided to one or more terminals of an electronic device that causes the voltage between those terminals to exceed the design voltage of the device, which could impair subsequent operation of the device. For example, a voltage at a terminal of an electronic device during an ESD event may exceed the breakdown voltage of one or more components of the device, and thereby potentially damage those components. It is therefore commonplace to provide an ESD protection clamp (voltage limiting device) across the terminals of such devices, IC's and electronic circuits or assemblies, which provides protection from excessive voltages across electrical components during ESD events. To avoid interfering with normal operation of the device being protected, the discharge protection circuitry is typically designed to turn on and conduct current when the applied voltage exceeds the operating voltage of the device but before the applied voltage exceeds the breakdown voltage of the device.

In practice, baseline, bipolar-based ESD protection devices (NPNB) have been widely used as discharge protection circuitry. Bidirectional NPN (NPNB) discharge protection circuitry possesses high current capability, making it very attractive device for automotive applications, which require system-level ESD compliance (IEC 61000-4-2 and ISO10605) in addition to component-level ESD standards (HBM, MM, CDM). However, NPNB discharge protection circuitry typically has low holding voltage (Vh).

To overcome this issue, the usual approach is to use a 2-stack (2 devices coupled in series) NPNB configuration (NPNB_1 and NPNB_2). Each NPNB contains two NPNs (NPN1 and NPN2) and a PNP. The NPNs use N+ as the emitter, DPN+NBL as the collector, P+ as the base terminal, and PHV/HVPW as the base area. Existing +40V/−40V system-level ESD clamp devices have been built targeting ~35V holding voltage (Vh), which requires a 2-stack baseline NPNB (two ESD clamp devices in series) to meet the targeted holding voltage.

However, the footprint of 2-stack ESD protection structures is a significant limiting factor in the minimum die size that can be achieved. The need for two or more interconnected ESD structures in series to be used to provide the required level of ESD protection is undesirable as it increases the overall size of the IC device.

BRIEF DESCRIPTION OF THE DRAWINGS

The disclosure is illustrated by way of examples and embodiments and is not limited by the accompanying figures. For simplicity and clarity of illustration, the figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The figures along with the detailed description are incorporated and form part of the specification and serve to further illustrate examples, embodiments and the like, and explain various principles and advantages, in accordance with the disclosure, where like reference numbers indicate similar elements.

DETAILED DESCRIPTION

Embodiments of the subject matter described herein relate to electrostatic discharge (ESD) protection devices and related circuitry. In a first aspect, a semiconductor device comprising an ESD protection device is disclosed. In a second aspect, an ESD protection device coupled between a first terminal and a second terminal of an integrated circuit is disclosed. A third aspect concerns a method for forming an ESD protection device coupled between a first terminal and a second terminal of an integrated circuit.

ESD protection clamps are circuit elements used to protect integrated circuit (IC) devices from voltage and current spikes that may be associated with an electrostatic discharge. To protect an IC device, an ESD clamp is connected between an input or output terminal of the device and a ground or common terminal. During normal operation, the ESD clamp does not conduct. But when subjected to an excessive voltage, the ESD clamp becomes conductive, conducting current to ground and limiting voltage to a desired safe level, thereby protecting the IC to which the ESD clamp is connected.

Generally, ESD clamps can be connected across any terminals of an IC that constitutes the electronic device to be protected. Accordingly, any reference herein to a particular input or output terminal of an IC is intended to include any and all other terminals of electronic circuits, not merely those used for input or output signals. With respect to structures or elements used for ESD protection, the terms device, clamp and transistor are used interchangeably.

Figure 1:
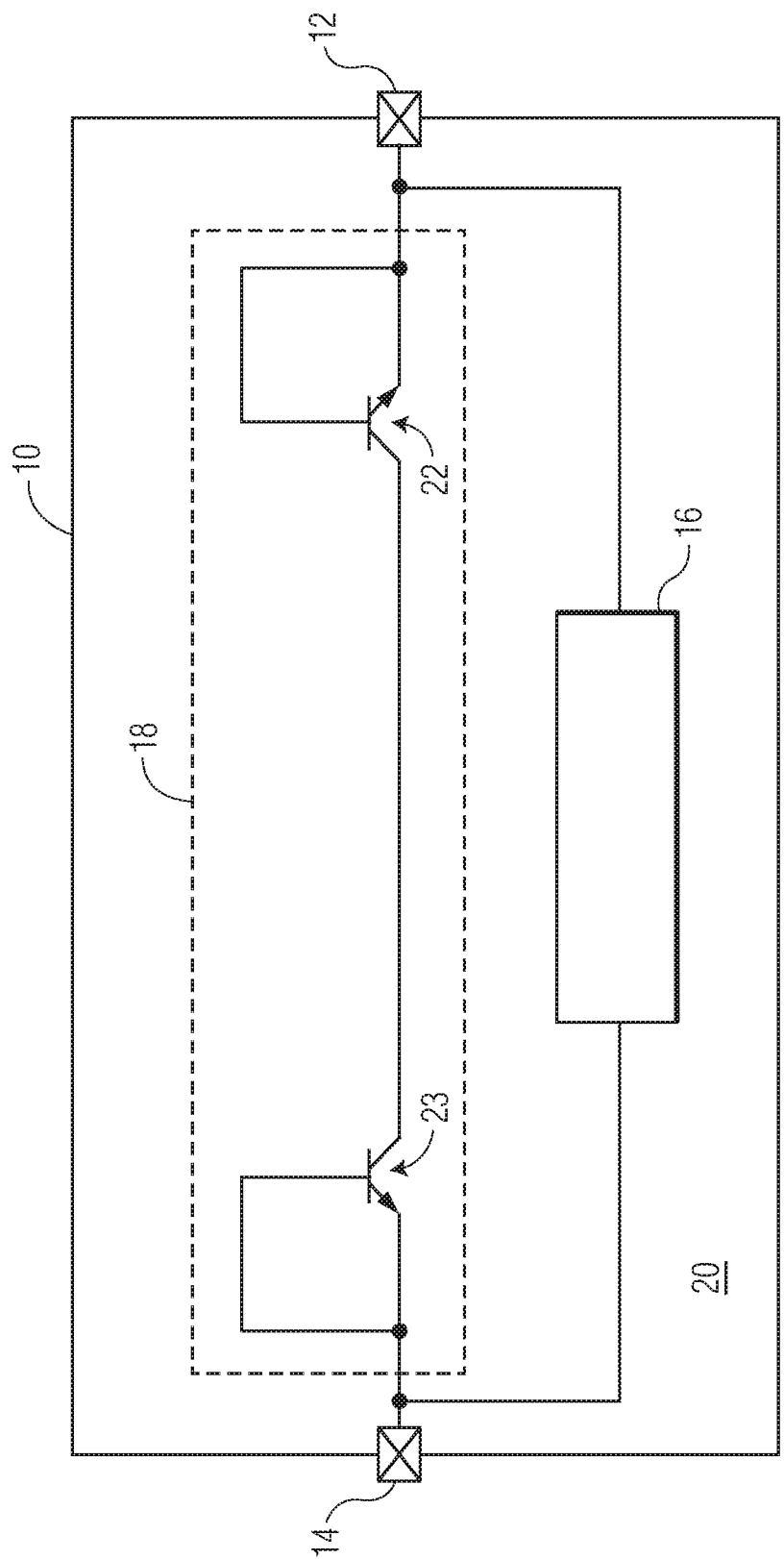
FIG. 1 is a schematic diagram of an exemplary electronic device in accordance with one embodiment of the invention.

Turning now to FIG. 1, an exemplary electronic device package 10 includes one or more package interfaces 12, 14, functional circuitry 16 coupled to the package interfaces 12, 14, and protection circuitry 18 coupled to the interfaces 12, 14. In exemplary embodiments, the functional circuitry 16 and the protection circuitry 18 are formed, fabricated, mounted, or otherwise provided on a substrate 20 and encapsulated in a common device package to obtain the electronic device 10. In this regard, in some embodiments, the substrate 20 may be realized as a common semiconductor substrate having both the functional circuitry 16 and the protection circuitry 18 fabricated thereon, while in other embodiments, the substrate 20 may be realized as a package substrate (e.g., a lead frame, circuit board, or the like) that the functional circuitry 16 and the protection circuitry 18 are soldered, affixed, or otherwise mounted to. It should be understood that FIG. 1 is a simplified representation of the electronic device 10 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 12, 14 generally represent the physical input/output interfaces to/from the functional circuitry 16 encapsulated in the electronic device 10. Depending on the embodiment, each of the package interfaces 12, 14 may be realized as an individual pin, pad, lead, terminal, solder ball, or another suitable physical interface to the electronic device 10. In accordance with one or more embodiments, the design (or intended) voltage for the first package interface 12 is greater than the design voltage for the second package interface 14. For example, the first package interface 12 may be realized as a positive reference (or supply) voltage input to the electronic device 10 and the second package interface 14 is realized as a negative reference (or ground) voltage input to the electronic device 10. Accordingly, for purposes of explanation, but without limitation, the first package interface 12 may alternatively be referred to herein as the higher voltage terminal, the positive reference voltage terminal, the supply voltage terminal, or the like, while the second package interface 14 may alternatively be referred to herein as the lower voltage terminal, the negative reference voltage terminal, the ground voltage terminal, or the like.

The functional circuitry 16 generally represents the components of the electronic device 10 configured to provide the desired functionality for the electronic device 10. In this regard, depending on the embodiment, the functional circuitry 16 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 10. In an exemplary embodiment, the functional circuitry 16 is coupled to the package interfaces 12, 14 to receive a supply voltage, design voltage, or another operating voltage that facilitates the desired operation of the functional circuitry 16.

Still referring to FIG. 1, the protection circuitry 18 is connected electrically between the higher voltage terminal 12 and the lower voltage terminal 14 and configured electrically parallel to the functional circuitry 16 to protect the functional circuitry 16 from a transient voltage difference between the device terminals 12, 14 that exceeds a breakdown voltage ($V_B$) of the functional circuitry 16. In the illustrated embodiment, the protection circuitry 18 functions as an ESD voltage clamp that begins conducting current when the transient voltage difference between the device terminals 12, 14 exceeds a transient triggering voltage ($V_{T1}$) of the protection circuitry 18. In this regard, both the steady state (or DC) breakdown voltage ($V_{TDC}$) and transient triggering voltage ($V_{T1}$) of the protection circuitry 18 are chosen to be greater than the supply (or operating) voltage ($V_O$) of the functional circuitry 16 but less than the breakdown voltage ($V_B$) of the functional circuitry 16. In this manner, the protection circuitry 18 conducts current when the voltage difference between the terminals 12, 14 exceeds a ESD triggering voltage (i.e., the DC breakdown voltage ($V_{TDC}$) or the transient triggering voltage ($V_{T1}$)) and thereby clamps the voltage difference that the functional circuitry 16 is exposed to. Thus, the likelihood of the functional circuitry 16 being exposed to a voltage difference that exceeds the breakdown voltage ($V_B$) of the functional circuitry 16 during an ESD event is reduced.

In exemplary embodiments, the protection circuitry 18 includes a pair of bipolar junction transistor (BJT) elements 22, 23 configured to provide an ESD voltage clamp. As illustrated, a first NPN bipolar transistor element 22 has an emitter electrode coupled to the higher voltage terminal 12, a base electrode electrically connected directly to the emitter electrode (e.g., short-circuited or via a negligible series impedance) and coupled to the higher voltage terminal 12, and a collector electrode coupled to the collector electrode of the second NPN bipolar transistor element 23. As described in greater detail below, in exemplary embodiments, the collector electrodes of the bipolar transistor elements 22, 23 are realized using a common doped region, that is, the bipolar transistor elements 22, 23 share a common collector electrode region formed in a semiconductor substrate. The emitter electrode of the second bipolar transistor element 23 is coupled to the lower voltage terminal 14 and the base electrode of the second bipolar transistor element 23 is electrically connected (or short-circuited) to the emitter electrode and coupled to the lower voltage terminal 14. The common collector electrodes of the bipolar transistor elements 22, 23 provide a parasitic bipolar junction transistor element configured between the base regions of the bipolar transistor elements 22, 23.

The protection circuitry 18 is bidirectional and capable of conducting current in either direction between terminals 12, 14 to clamp voltages between terminals 12, 14 from ESD events with either polarity. In other words, the protection circuitry 18 conducts current from the higher voltage terminal 12 to the lower voltage terminal 14 when the voltage at the higher voltage terminal 12 exceeds the voltage at the lower voltage terminal 14 by more than a first triggering voltage and conducts current from the lower voltage terminal 14 to the higher voltage terminal 12 when the voltage at the lower voltage terminal 104 exceeds the voltage at the higher voltage terminal 12 by more than a second triggering voltage. For purposes of explanation, the triggering voltage differential for conducting current from the higher voltage terminal 12 to the lower voltage terminal 14 may alternatively be referred to herein as the forward triggering voltage and the triggering voltage differential for conducting current from the lower voltage terminal 14 to the higher voltage terminal 12 may alternatively be referred to herein as the reverse triggering voltage.

Figure 2:
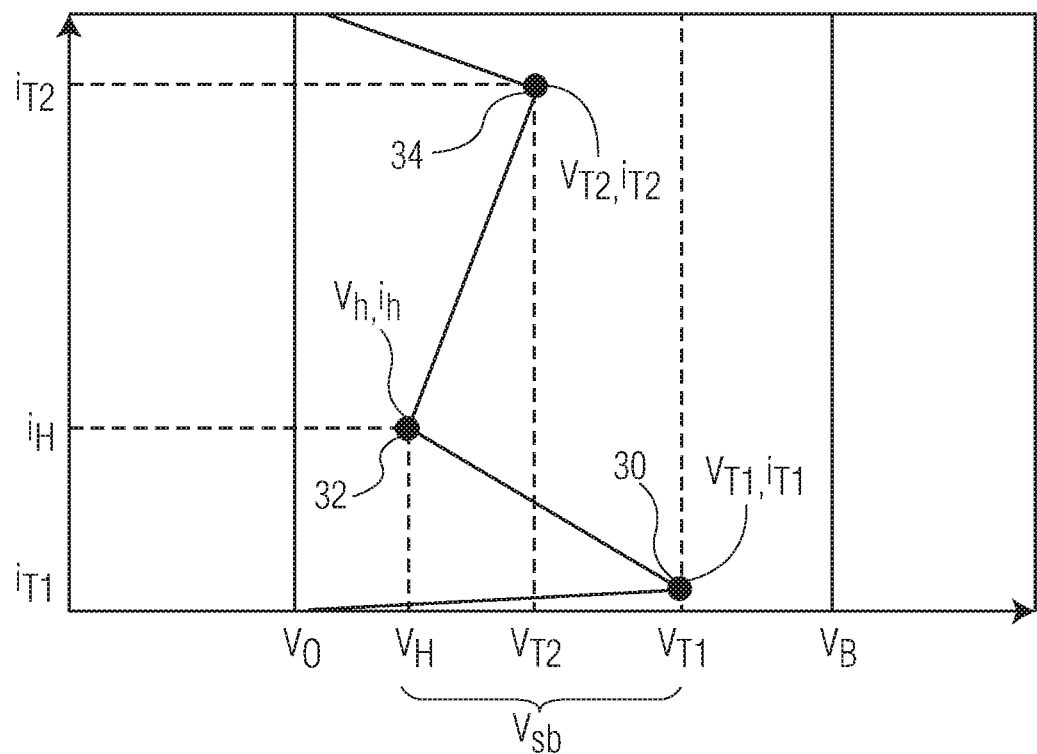
FIG. 2 shows a graph of a transmission line pulse (TLP) current (I) versus voltage (V) for a typical electrostatic discharge (ESD) protection device.

FIG. 2 is a graph showing a transmission line pulse (TLP) current (I) versus voltage (V) for a typical electrostatic discharge (ESD) protection device such as, for example, the protection circuitry 18 of FIG. 1. In operation, as the voltage applied to the terminals is increased, very little current flows through the ESD protection device until the triggering voltage $V_{t1}$ at point 30 is reached. The value $V_{t1}$ refers to forward triggering voltage. Upon reaching the triggering voltage $V_{t1}$, avalanche breakdown in the BJT 23 occurs and the ESD protection device 18 turns on and the voltage drops to the holding voltage $V_h$ at point 32, whereby current flow through the device is $I_h$. The difference between the triggering voltage $V_{t1}$ and the holding voltage $V_h$ is referred to as the snapback voltage, denoted $V_{sb}$. Depending upon the internal impedance of the voltage source, current and voltage may further increase to point 34 at current $I_{t2}$ and voltage $V_{t2}$, beyond which destructive failure may occur leading to further current increase accompanied by voltage decrease. Generally, $I_{t2}$ indicates the current capability of the ESD protection device before the device is thermally damaged.

In high-voltage or high-power ESD clamp implementations (e.g., those used in the automotive industry) ESD clamps having a higher snapback voltage $V_{sb}$ generally provide improved latch-up immunity. For example, in one application, an electrical disturbance from the battery may be on the order of 35V. In this situation, the holding voltage needs to remain above 35V in order for the ESD device to remain within allowable limits. However, to meet a >35V $V_h$, a 2-stack NPNB ESD clamp device (two ESD clamp devices coupled in series) is currently required, which undesirably has a relatively large footprint.

Therefore, in one embodiment, a 40V/–40V ESD clamp composed of only a 1-stack NPNB (bidirectional NPN) for footprint reduction may be used in high voltage applications. The ESD clamp device combines a floating N-P tie and a highly doped P-type doped base well enclosing the N-type doped emitter region and the floating N-P tie. A single ESD protection device (1-stack) as described herein achieves desirable silicon results with >35V $V_h$ until high current level (5A), strong current capability, a high system-level passing-level, and greater than 35% footprint reduction compared to known ESD clamps which require two ESD devices in series (2-stack configuration) to meet a >35V $V_h$.

FIGS. 3-12 illustrate, in cross-section, an ESD protection device structure 100 suitable for use as the protection circuitry 18 in an electronic device in accordance with one or more exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN bipolar junction transistor elements, the subject matter is not intended to be limited to NPN bipolar junction transistor elements and may be implemented in an equivalent manner for PNP bipolar junction transistor elements (e.g., by interchanging the conductivities of the doped regions).

Figure 12:
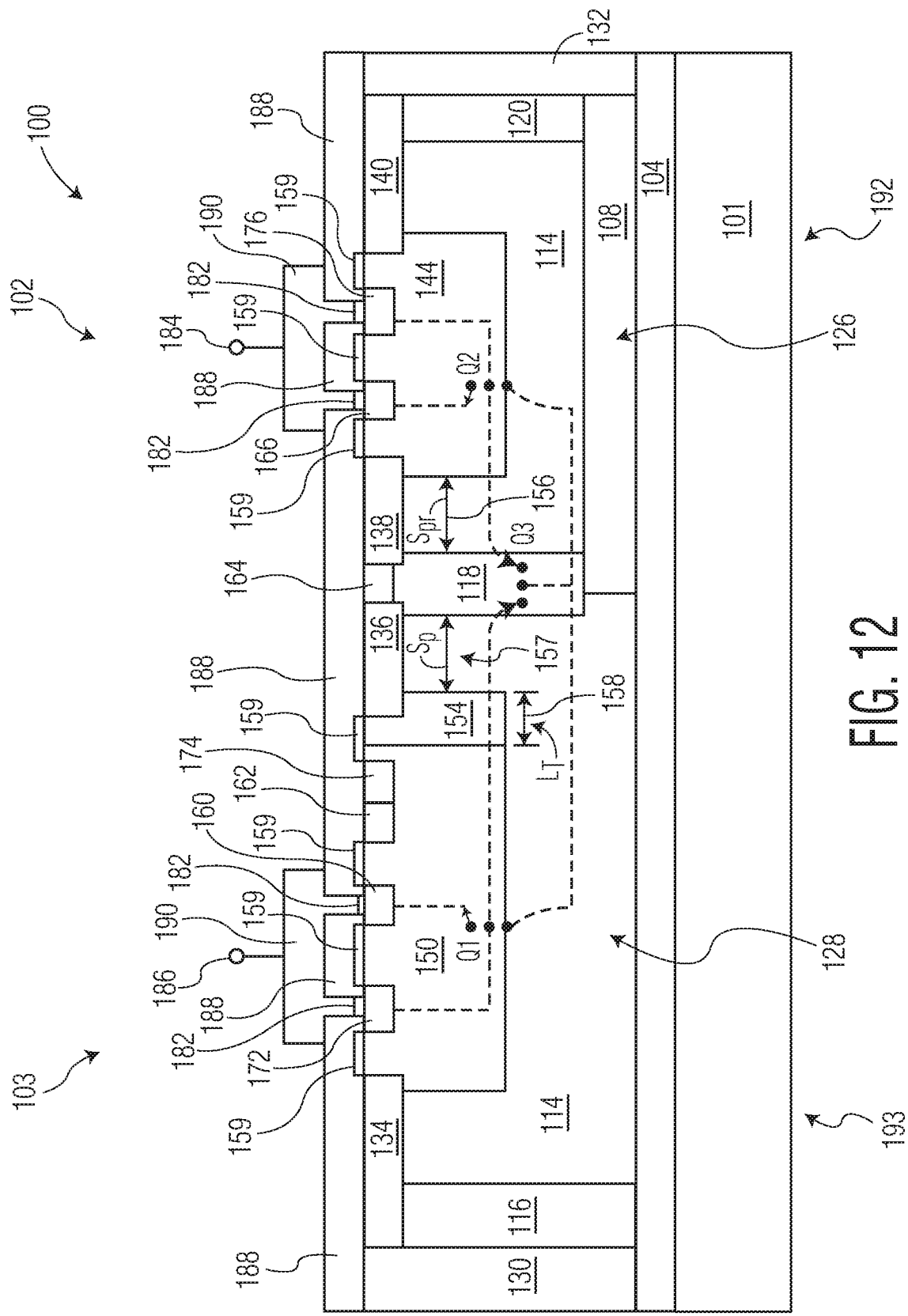
FIG. 12 illustrates a cross-sectional view of the ESD protection device of FIG. 11 at a subsequent processing stage and during operation with a schematic representation overlay in accordance with an embodiment of the invention.

As best illustrated in FIG. 12, with reference to FIG. 1, in exemplary embodiments, the protection circuitry 18 is realized as the protection device structure 100, which includes a pair of transistors 192, 193 corresponding to BJTs 22, 23. In this regard, a first physical interface terminal 184 is realized as the higher voltage terminal 12 and a second physical interface terminal 186 is realized as the lower voltage terminal 14. Further, the first transistor 192 (BJT 22) is comprised of emitter region 166, base regions 144, 176, and collector regions 108, 118. The second transistor 193 (BJT 23) is comprised of emitter region 160, base regions 150, 154, 172, and collector regions 108, 118. In exemplary embodiments, the protection device structure 100 is fabricated on a SOI substrate that provides vertical isolation that allows multiple instances of the protection device structure 100 to be stacked or cascaded and connected in series to achieve a desired triggering voltage and/or holding voltage required for the particular function circuitry 16 of interest.

Figure 3:
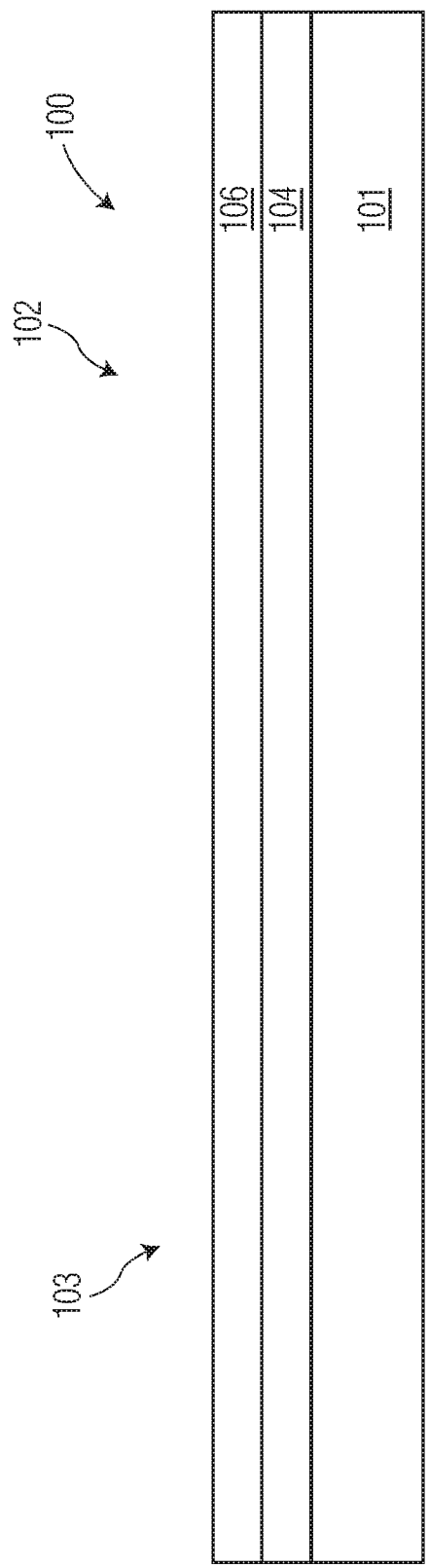
FIG. 3 illustrates a cross-sectional view of an ESD protection device implemented in a semiconductor substrate at a processing stage in accordance with an embodiment of the invention.

FIG. 3 is a cross-sectional view of an ESD protection device 100 implemented in a semiconductor substrate at an initial stage in processing in accordance with an embodiment of the invention. ESD protection device 100 is a dual polarity (bi-directional) ESD clamp device for use in protecting electronic devices and circuits. As will be described below, the ESD protection device will include two interconnected bipolar junction transistors (BJTs) 192 and 193 (see FIG. 12) and may be incorporated into an ESD protection clamp.

Illustrated in FIG. 3 is a substrate 101 on which ESD protection device 100 is formed. Substrate 101 is a semiconductor substrate and is provided with a buried oxide layer (BOX) 104. Depending upon the implementation, substrate 101 may be either of N-type or P-type. Substrate 101 includes a first transistor region 102 in which a first transistor 192 of the two interconnected transistors will be formed, and a second transistor region 103 in which the second transistor 193 will be formed. Buried oxide layer (BOX) 104 provides electrical isolation to devices formed over substrate 101.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as, for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

Still referring to FIG. 3, a semiconductor layer 106 is formed over BOX layer 104. In one embodiment, semiconductor layer 106 is epitaxially deposited over BOX layer 104 and may be either N-type or P-type doped. In one embodiment, semiconductor layer 106 has a thickness in a range of 0.5 micrometer (μm) to 4 μm. As described in greater detail below, in exemplary embodiments, the layer 106 of semiconductor material is utilized to epitaxially grow additional semiconductor material thereon, and accordingly, for convenience, but without limitation, the layer 106 of semiconductor material may alternatively be referred to herein as the seed layer. In exemplary embodiments, the semiconductor (seed) layer 106 is lightly doped. For example, the semiconductor (seed) layer 106 may be a P-type silicon material having a P-type doping concentration in the range of about $1 \times 10^{15}/cm^3$ to about $8 \times 10^{15}/cm^3$. The support layer 101 may also be doped with the same (or different) conductivity type as the semiconductor (seed) layer 106. In exemplary embodiments, the support layer 101 is an N-type silicon material. It should be understood that the protection devices and the fabrication processes described herein are not constrained by the substrate of semiconductor material utilized, and the fabrication process described herein may also be used to create protection devices on a bulk semiconductor substrate.

Figure 4:
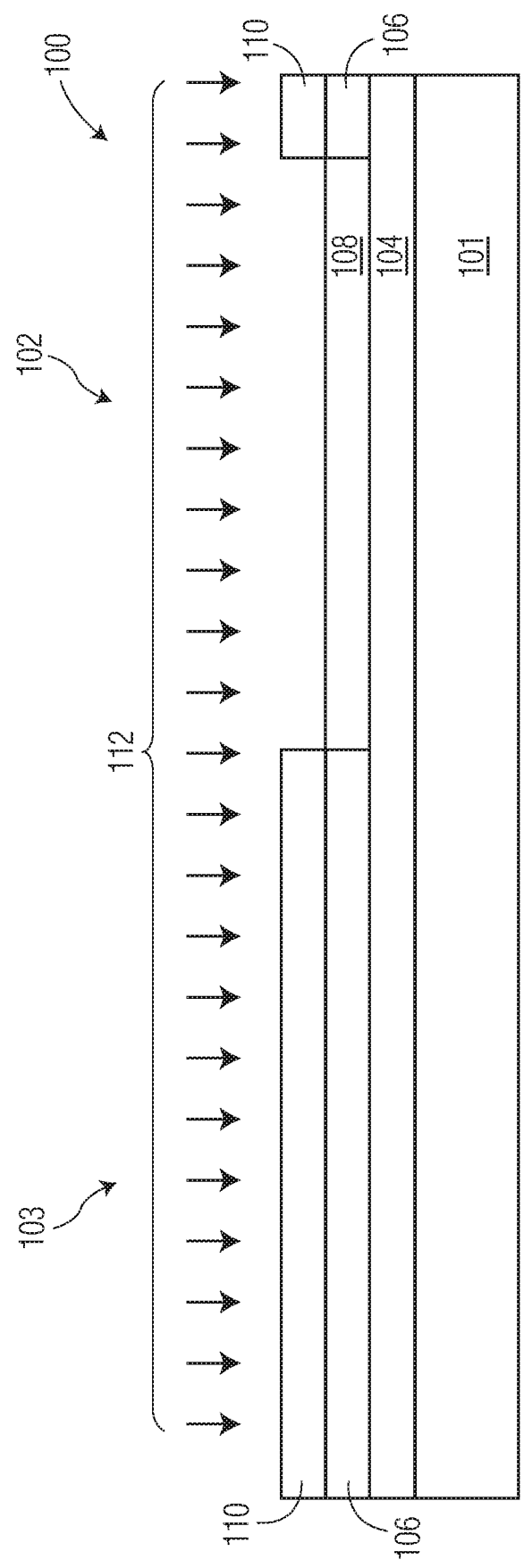
FIG. 4 illustrates a cross-sectional view of the ESD protection device of FIG. 3 at a subsequent processing stage in accordance with an embodiment of the invention.

Referring to FIG. 4, in exemplary embodiments, fabrication of the ESD protection device structure 100 continues by masking a portion of the device structure corresponding to second transistor region 103 of the ESD protection device structure 100 and forming a buried doped layer 108 of semiconductor material within the exposed portion of the semiconductor (seed) layer 106, the buried doped layer 108 having a conductivity type that is opposite the conductivity of the seed layer 106. In exemplary embodiments, the buried doped layer (NBL) 108 does not extend underneath and across the portion of the device structure 100 corresponding to second transistor region 103, which further increases the holding voltage. The buried doped layer 108 is formed by masking the protection device structure 100 with a masking material 110, such as a photoresist material, that is patterned to provide an implantation mask that exposes a portion of the semiconductor (seed) layer 106 to be used for the buried doped layer 108. The buried doped layer 108 is then formed by implanting N-type ions, such as antimony ions or phosphorous ions, illustrated by arrows 112, in the semiconductor (seed) layer 106 with a doping concentration in the range of about $1 \times 10^{18}/cm^3$ to about $1 \times 10^{19}/cm^3$. Thus, in the illustrated embodiment, the buried doped layer 108 may alternatively be referred to herein as N-doped buried layer (NBL). In the illustrated embodiment, the depth of the buried doped layer (NBL) 108 (after subsequent thermal annealing or any other diffusion) corresponds to the thickness of the semiconductor (seed) layer 106 so that the buried doped layer (NBL) 108 extends to and abuts or otherwise contacts the semiconductor (seed) layer 106 and the insulating (BOX) layer 104. For example, in accordance with one or more embodiments, the thickness of the semiconductor (seed) layer 106 is within the range of about 1 micrometer (or micron) to about 4 microns (depending on the needs of a particular application), and the buried doped layer (NBL) 108 has a depth in the range of 1 micron to about 4 microns, which corresponds to the thickness of the semiconductor (seed) layer 106. In one embodiment, the thickness of the semiconductor (seed) layer 106 (and thereby the buried doped layer (NBL) 108) is about 2 microns.

As shown in FIG. 4, in exemplary embodiments, the buried doped layer (NBL) 108 underlies the first transistor region 102 for the first transistor 192 (BJT 22) while the semiconductor material of the semiconductor (seed) layer 106 underlying the second transistor region 103 for the second transistor 193 (BJT 23) remains intact overlying the buried oxide (BOX) layer 104.

Figure 5:
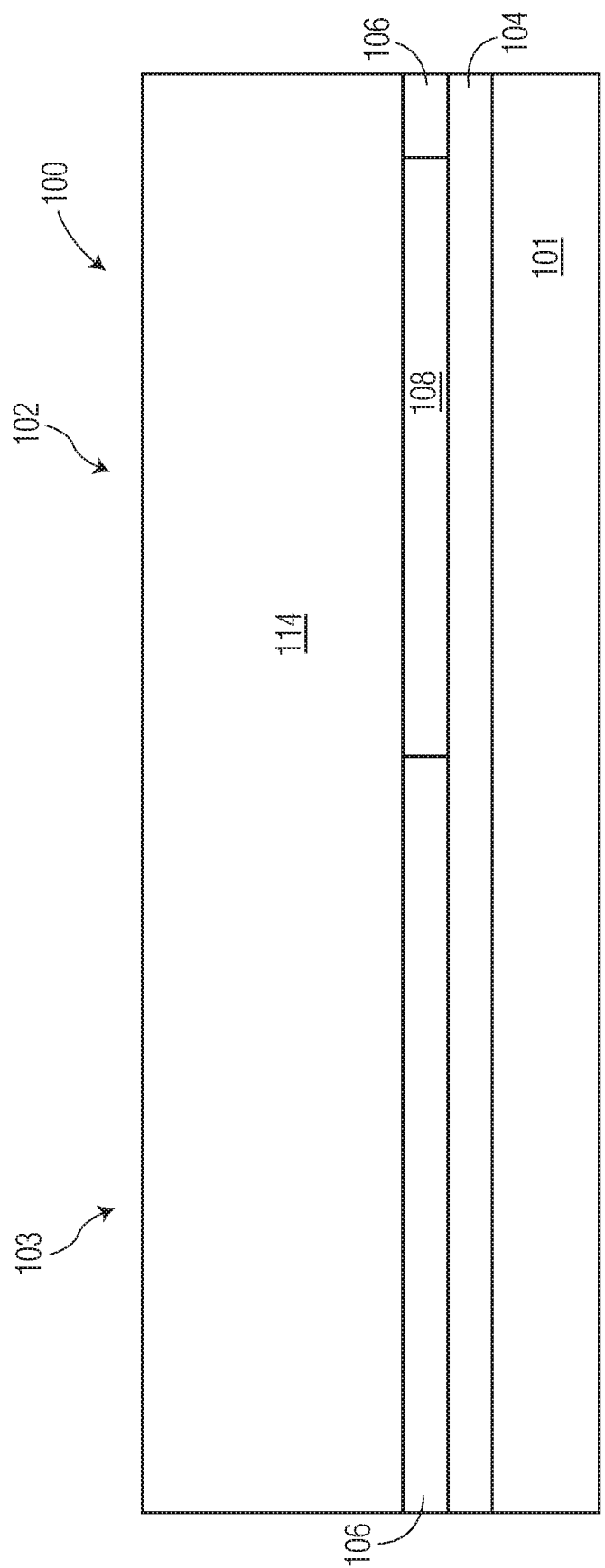
FIG. 5 illustrates a cross-sectional view of the ESD protection device of FIG. 4 at a subsequent processing stage in accordance with an embodiment of the invention.

After forming the buried doped layer (NBL) 108, fabrication of the ESD protection device structure 100 continues by removing the masking material 110 and forming or otherwise providing another doped region of semiconductor material 114 that has a desired thickness overlying the buried doped layer (NBL) 108 and a conductivity type opposite the buried doped layer (NBL) 108, resulting in the ESD protection device structure 100 illustrated in FIG. 5. For example, a P-type epitaxial (P-epi) layer 114 may be formed by epitaxially growing silicon material on the semiconductor (seed) layer 106 and buried doped layer (NBL) 108, and in-situ doping the silicon material by adding boron ions (or other P-type ions) to the reactants used to epitaxially grow the layer 114. In one or more embodiments, the epitaxial (P-epi) layer 114 has a P-type doping concentration in the range of about $1 \times 10^{15}/cm^3$ to about $8 \times 10^{15}/cm^3$. In an exemplary embodiment, the epitaxial (P-epi) layer 114 is grown to a thickness in the range of about 3 microns to about 6 microns, which may vary depending on the needs of a particular application. It should be understood that the protection devices and the fabrication processes described herein are not constrained by the manner in which the buried doped region (NBL) and/or P-type layer are formed, and the protection device structure 100 illustrated in FIG. 5 may be fabricated or otherwise achieved in a variety of alternative manners (e.g., the P-type layer 114 does not necessarily need to be realized as an epitaxial layer and does not necessarily need to be epitaxially grown and/or in-situ doped, the buried doped region (NBL) 108 does not necessarily need to be formed by ion implantation, etc.). In alternative embodiments, layer 114 may have the same conductivity type (e.g., N-type) as the buried doped region (NBL) 108. That said, for purposes of explanation and without limitation, the subject matter will be described herein in the context of a P-type epitaxial layer 114.

Figure 6:
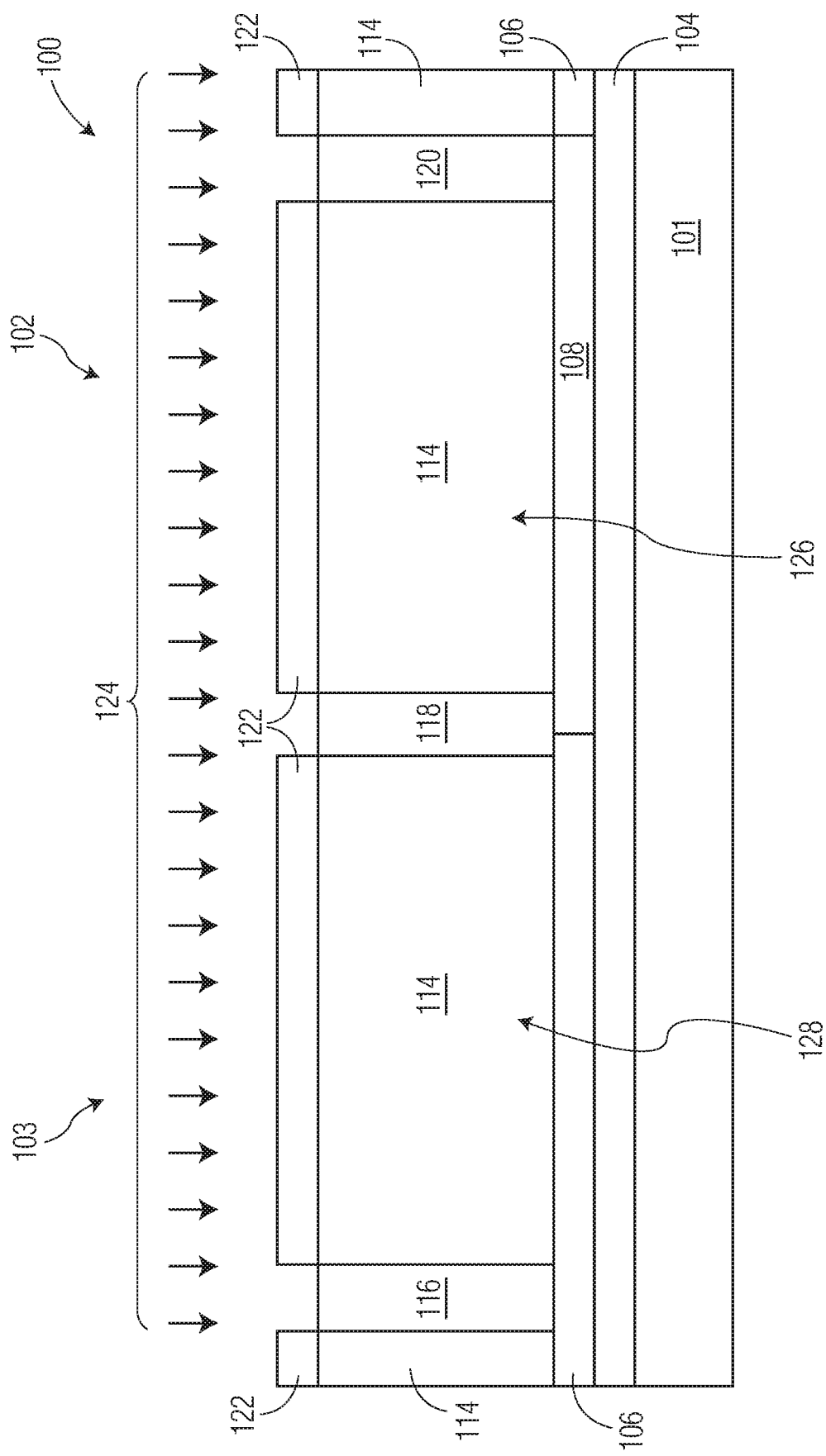
FIG. 6 illustrates a cross-sectional view of the ESD protection device of FIG. 5 at a subsequent processing stage in accordance with an embodiment of the invention.

Turning now to FIG. 6, after forming the epitaxial (P-epi) layer 114, the fabrication process continues by masking portions of the epitaxial layer 114 and forming doped, deep N-well regions 116, 118, 120 of semiconductor material having the opposite conductivity type within the epitaxial (P-epi) layer 114. The doped, deep N-well regions 116, 118, 120 can be formed by masking the ESD protection device structure 100 with a masking material 122 that is patterned to provide an implantation mask that exposes an interior (or central) portion of the epitaxial (P-epi) layer 114 to be used for the interior deep N-well region 118 and peripheral portions of the epitaxial (P-epi) layer 114 to be used for peripheral deep N-well regions 116, 120 that abut subsequently formed deep trench isolation regions. For example, deep N-type well regions 116, 118, 120 can be formed by implanting N-type ions, such as phosphorous ions or arsenic ions, illustrated by arrows 124, in the epitaxial (P-epi) layer 114 with a doping concentration in the range of about $1 \times 10^{16}/cm^3$ to about $1 \times 10^{19}/cm^3$, and more preferably within the range of about $1 \times 10^{17}/cm^3$ to about $8 \times 10^{16}/cm^3$ to provide doped, deep N-well regions 116, 118, 120 with a depth (after subsequent thermal annealing or any other diffusion) corresponding to the thickness of the epitaxial (P-epi) layer 114 so that the central and a peripheral deep N-well region 118, 120 extend to and abut the N-type buried layer (NBL) 108, thereby electrically connecting the two deep N-well regions 118, 120 to the N-type buried layer (NBL) 108. As illustrated, the deep N-well regions 116, 118, 120 partition the P-type epitaxial layer 114 into separate P-type regions 126, 128 having a respective bipolar junction transistor element of the ESD protection circuitry fabricated therein.

Figure 7:
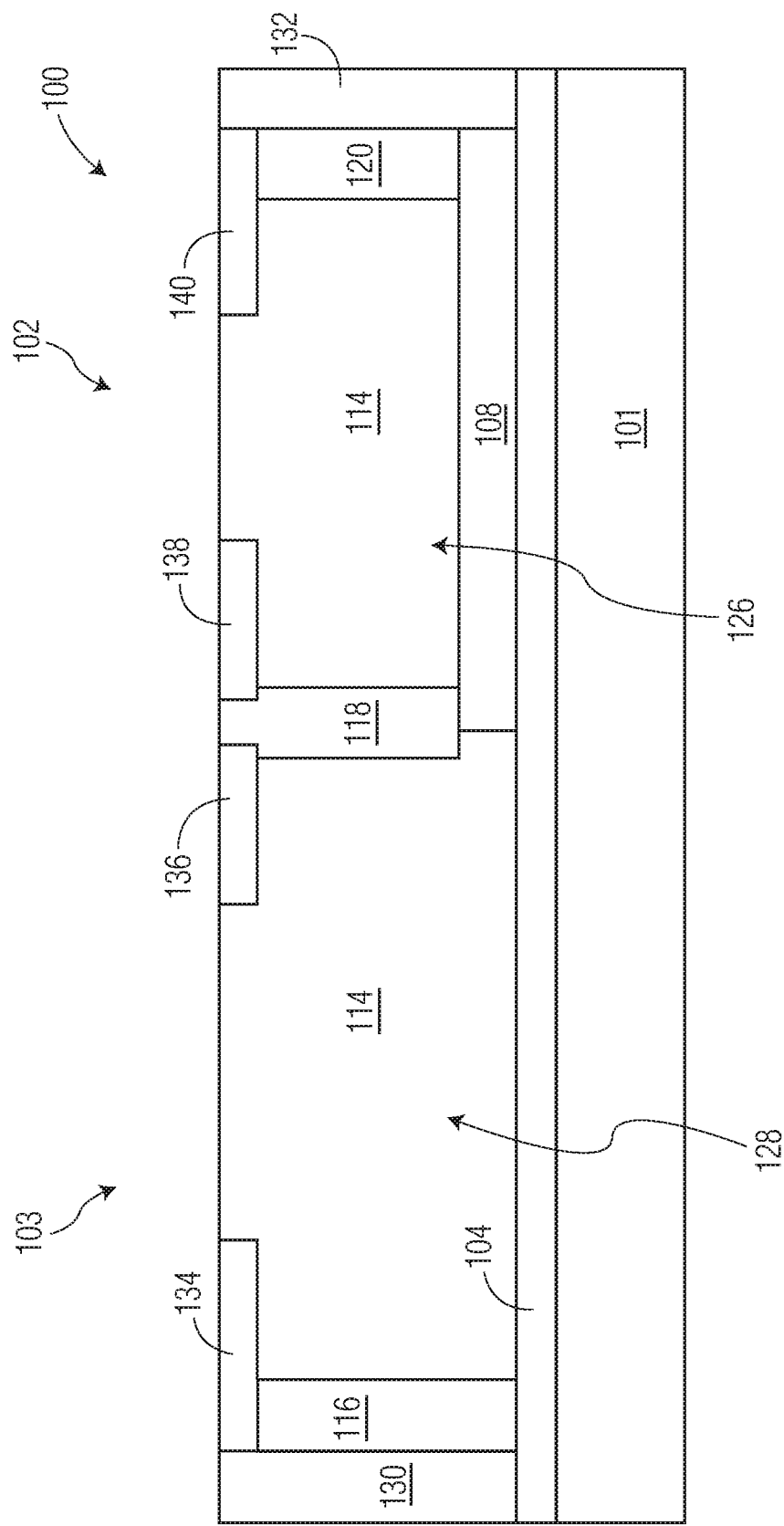
FIG. 7 illustrates a cross-sectional view of the ESD protection device of FIG. 6 at a subsequent processing stage in accordance with an embodiment of the invention.

In the illustrated embodiment, after forming the deep N-well regions 116, 118, 120, the fabrication process continues by forming isolation regions, resulting in the ESD protection device structure 100 illustrated in FIG. 7. In an exemplary embodiment, the fabrication process isolates the ESD protection circuitry from adjacent semiconductor devices by performing deep trench isolation (DTI) to provide deep isolation regions 130, 132 of dielectric material that provide lateral isolation to the device. For example, to form deep isolation regions 130, 132, the interior portion of the ESD protection device structure 100 can be masked with a masking material that is subsequently patterned to expose the peripheral portions of the epitaxial (P-epi) layer 114 and underlying portions of the semiconductor (seed) layer 106, which are then etched until the buried oxide (BOX) layer 104 is exposed. Thereafter, a dielectric material, such as an oxide material, can be deposited in the resulting trenches or grown on exposed surfaces of the trenches to fill the trenches, resulting in deep isolation (DTI) regions 130, 132, which extend from the surface of the ESD device 100 to the buried oxide (BOX) layer 104.

Additionally, shallow isolation regions 134, 136, 138, 140 of a dielectric material are formed in the upper portions of the deep N-well regions 116, 118, 120 and adjacent portions of P-type epitaxial regions 126, 128 by performing shallow trench isolation (STI). To form the shallow isolation regions 134, 136, 138, 140, portions of the epitaxial (P-epi) layer 114 are masked with a masking material that is patterned to expose the peripheral deep N-well regions 116, 120, portions of the interior (central) deep N-well region 118 adjacent to the epitaxial layer 114 (while masking the mid or center portion of the interior (central) deep N-well region 118), and portions of the P-type epitaxial regions 126, 128 adjacent to the deep N-type well regions 116, 118, 120. As such, the shallow isolation regions 134, 136, 138, 140 are formed overlying portions of the epitaxial (P-epi) layer 114 adjacent to the deep N-well regions 116, 118, 120. The exposed portions of the deep N-well regions 116, 118, 120 and adjacent portions of the P-type epitaxial layer 114 are then etched to a desired depth (which is less than the thickness of the epitaxial layer 114). A dielectric material, such as an oxide material, can be deposited to fill the trenches, resulting in shallow isolation regions 134, 136, 138, 140. In accordance with one or more exemplary embodiments, the depth of the shallow isolation regions 134, 136, 138, 140 is in the range of about 0.05 microns to about 1 micron, and more preferably, within the range of 0.2 microns to 0.5 microns. In the illustrated embodiment, the shallow isolation regions 134, 136, 138, 140 extend laterally beyond the boundaries of the deep N-well regions 116, 118, 120.

Figure 8:
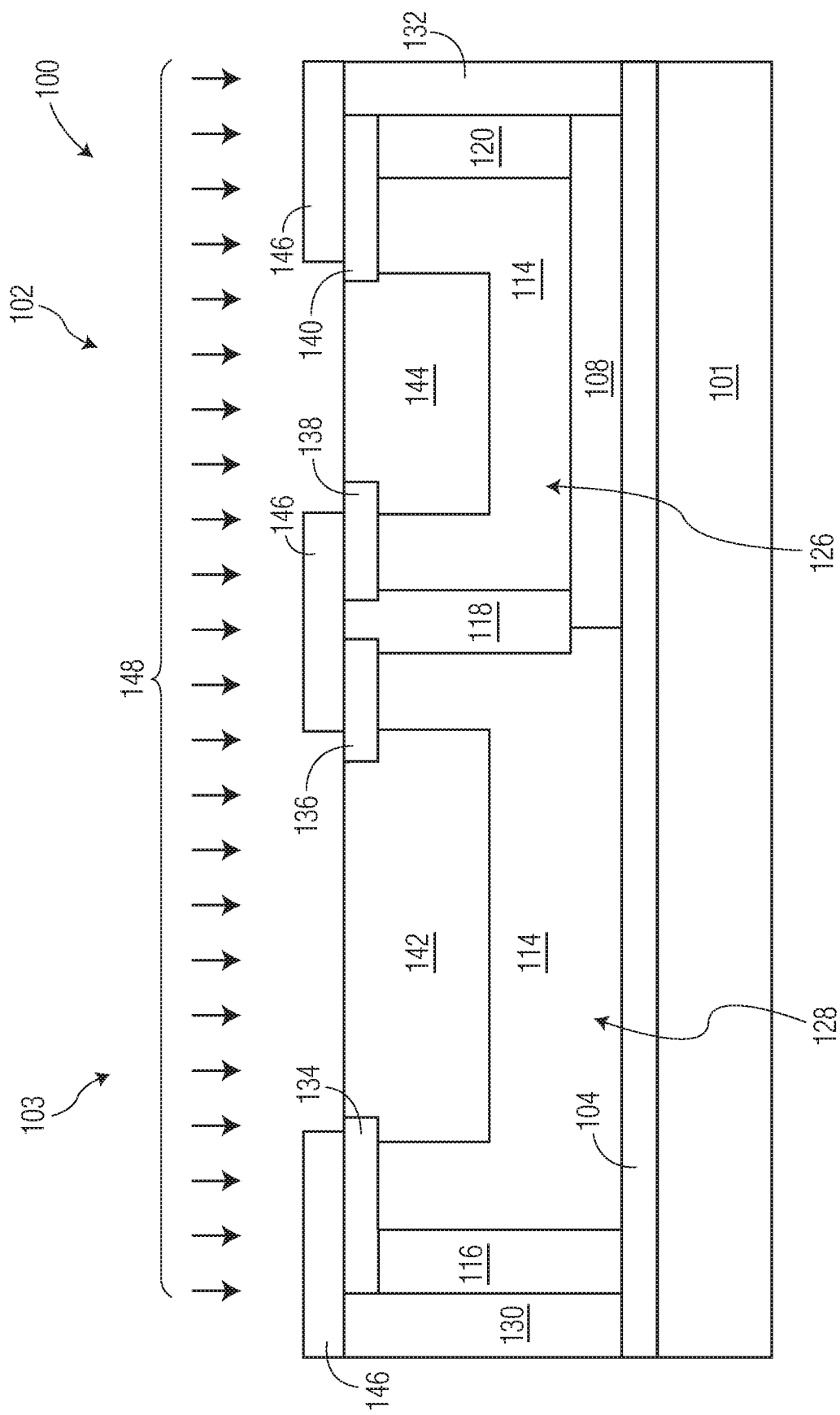
FIG. 8 illustrates a cross-sectional view of the ESD protection device of FIG. 7 at a subsequent processing stage in accordance with an embodiment of the invention.

Turning now to FIG. 8, fabrication of the protection device structure 100 continues by masking the deep N-well regions 116, 118, 120 and forming P-type (PHV) well regions 142, 144 in the interior portions of regions 126, 128 of the P-type epitaxial layer 114 between deep N-well regions 116, 118, 120. The P-type (PHV) well regions 142, 144 function as a portion of the base regions of a respective transistor element 192, 193 (BJT 22, 23) that surrounds or otherwise encompasses the emitter electrode of that respective bipolar junction transistor element.

To fabricate P-well (PHV) regions 142, 144, the ESD protection device structure 100 is masked with a masking material 146 that is patterned to provide an implantation mask that exposes interior portions of regions 126, 128 of the epitaxial (P-epi) layer 114 while masking the N-type regions 116, 118, 120 and deep trench isolation regions 130, 132. In the illustrated embodiment of FIG. 8, the lateral edges of the implantation mask 146 are offset from lateral boundaries of the interior shallow isolation regions 134, 136, 138 to expose portions of the peripheral shallow isolation regions 134, 136, 138 so that the subsequently formed P-well (PHV) regions 142, 144 extend laterally beneath the shallow isolation regions 134, 136, 138. The P-well (PHV) regions 142, 144 are then formed by implanting P-type ions, such as boron ions, illustrated by arrows 148, in the exposed portions of the epitaxial layer 114 with a dopant concentration that is greater than the dopant concentration of the epitaxial layer 114. Preferably, the doping concentration is within the range of $1 \times 10^{17}/cm^3$ to about $1 \times 10^{19}/cm^3$, and more preferably about $4 \times 10^{17}/cm^3$, to provide the doped P-well regions 142, 144 with a depth (after subsequent thermal annealing or any other diffusion) that is greater than a depth of the shallow isolation regions 134, 136, 138, 140 but less than the thickness of the epitaxial layer 114, such that at least a portion of the lighter doped epitaxial layer 114 remains vertically between the P-well (PHV) regions 142, 144 and the N-type buried layer (NBL) 108. In accordance with one or more exemplary embodiments, the depth of the P-well (PHV) regions 142, 144 is greater than 0.3 microns.

Figure 9:
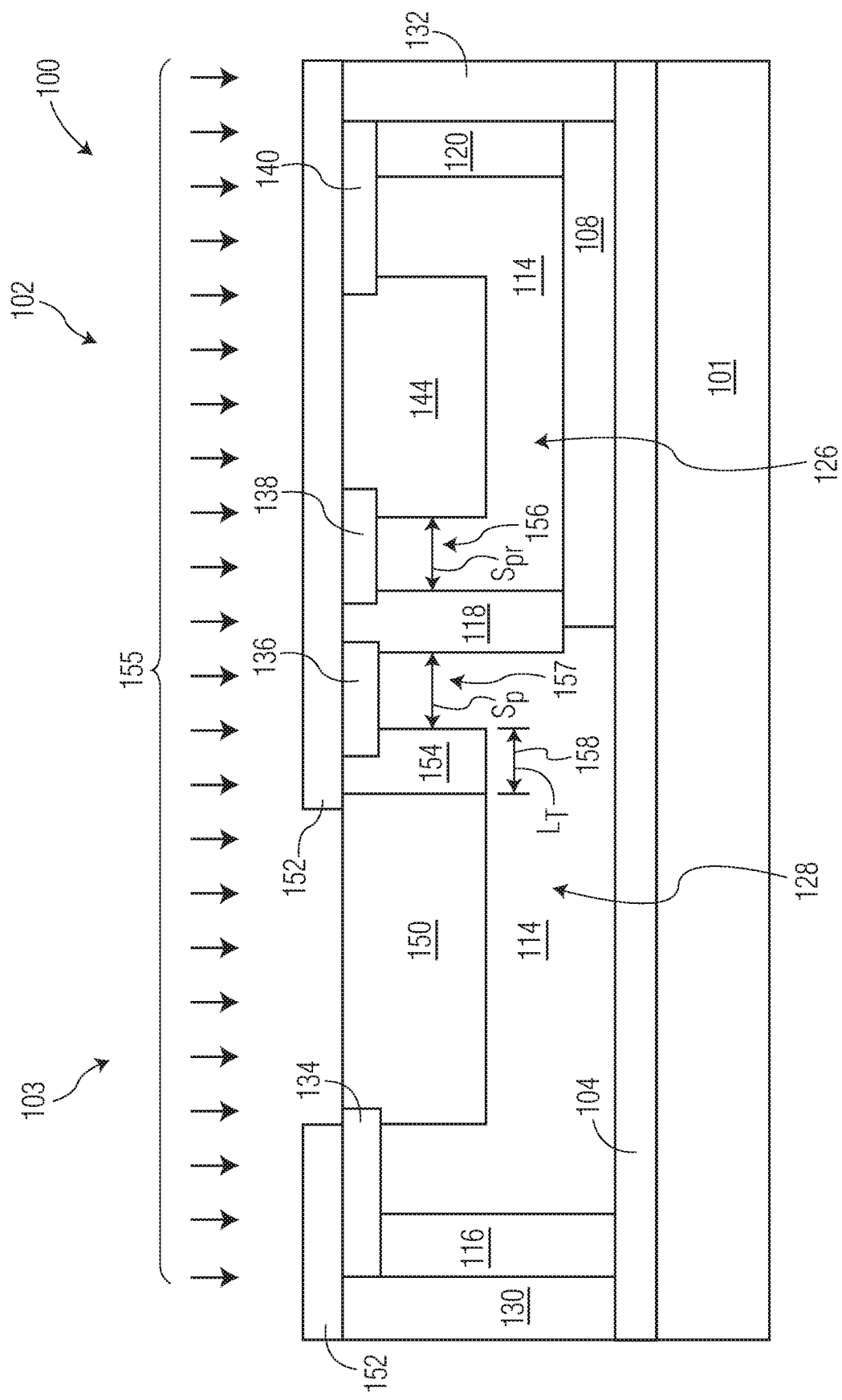
FIG. 9 illustrates a cross-sectional view of the ESD protection device of FIG. 8 at a subsequent processing stage in accordance with an embodiment of the invention.

Turning now to FIG. 9, the illustrated fabrication process continues by masking the deep N-type well regions 116, 118, 120 and the interior portion of the P-type (PHV) well region 142, and further doping P-well (PHV) region 142 in the interior portion of epitaxial region 128 to provide a highly doped, P-well (LVPW/PHV) region 150, which functions as a relatively higher doped (higher conductivity) portion of the base region of the second transistor 193 (BJT 23). Highly doped P-well region 150 is composed of a low voltage P-doped well (LVPW) region superimposed on the P-type high voltage (PHV) region 142. To achieve a desired breakdown voltage, a relatively lighter doped triggering well (PHV) region 154 having a lower conductivity (or higher resistivity) than the relatively higher doped base well region 150 is provided between the highly doped P-well base region 150 and the collector (DPN) region 118. The highly doped P-well (LVPW/PHV) region 150 is situated between triggering well region 154 and a peripheral deep N-type well region 116. In exemplary embodiments, the highly doped P-type base well region 150 is formed within the epitaxial region 128 abutting or otherwise in contact with triggering P-well (PHV) region 154.

Referring to FIG. 9, to fabricate highly doped P-well (LVPW/PHV) base region 150, the ESD protection device structure 100 is masked with a masking material 152 that is patterned to provide an implantation mask that exposes a peripheral portion of the P-well (PHV) region 142 and masks the triggering P-well (PHV) region 154, the deep N-type well regions 116, 118, 120, and the interior shallow isolation regions 136, 138. In the illustrated embodiment of FIG. 9, the lateral edge of the implantation mask 152 is offset from the lateral boundary of the peripheral shallow isolation regions 134 to expose a portion of the peripheral shallow isolation regions 134 so that the subsequently formed P-well base region 150 extends laterally beneath shallow isolation region 134. The P-well base region 150 is then formed by implanting P-type ions, such as boron ions, illustrated by arrows 155, to further dope the exposed peripheral portion (150) of the P-well (PHV) region 142 within epitaxial region 128 with a dopant concentration that is greater than the dopant concentration of the triggering well region 154, preferably within the range of about $5 \times 10^{17}/cm^3$ to about $5 \times 10^{19}/cm^3$, and more preferably about $1 \times 10^{18}/cm^3$ to about $1 \times 10^{19}/cm^3$, and at an energy level in the range of about 100 keV to about 1500 keV to provide the P-well (LVPW/PHV) base region 150 with a depth (after subsequent thermal annealing or any other diffusion) that is greater than a depth of the shallow isolation regions 134, 136, 138, 140 but less than the thickness of the epitaxial layer 114, so that at least a portion of the lighter doped P-type epitaxial layer 114 remains vertically between the P-well base region 150 and the N-type buried layer (NBL) 108. In accordance with one or more exemplary embodiments, the depth of the P-well base region 150 is greater than 0.3 microns. Although FIG. 9 illustrates the depth of the P-well base region 150 as being equal to the depth of triggering well region 154, in other embodiments, the depth of the P-well base region 150 can be greater than or less than the depth of the triggering well region 154.

In alternative embodiments, the P-type well region 150 can be formed by initially masking (e.g., with mask 152, FIG. 9) and doping an interior portion of the P-type epitaxial layer 114 in region 128 with a P-type dopant concentration to form a low voltage P-doped well (LVPW) region (e.g., 150), and then masking (e.g., with mask 146, FIG. 8) and doping to form P-well (PHV) region 144 in transistor region 102 and to superimpose a P-type high voltage (PHV) region on the low voltage P-doped well (LVPW) region in transistor region 103 to form a highly doped P-well region (e.g., 150) and the adjacent triggering P-well region (e.g., 154), as depicted in FIG. 9.

Referring again to FIG. 9, the intermediate portions 156, 157 of the relatively lighter doped epitaxial (P-epi) layer 114 residing between a lateral boundary of the deep N-well collector region 118 and the adjacent lateral boundary of a respective P-type (PHV) well region 144, 154, dictates avalanche breakdown voltage across the collector-base junction (e.g., between N-well region 118 and a respective P-type (PHV) well region 144, 154). Avalanche breakdown in the intermediate portions 156, 157 between N-well region 118 and a respective P-well (PHV) region 144, 154 generates carriers, which, in turn, increase the electrical potential of the respective P-well base region 144, 154 to forward-bias the base-emitter junction and turn on a respective bipolar transistor element. The P-well regions 144, 154 are spaced apart from the collector region 118 by a lateral distance or spacing Spr, Sp, respectively, that defines a desired breakdown voltage of the respective transistors 192, 193 (BJTs 22, 23). In the illustrated embodiments described herein, an intermediate portion 156, 157 of a respective lighter doped P-type epitaxial region 114 in transistor regions 102, 103, remains intact between the lateral boundary of a respective P-well region 144, 154 formed therein and the proximal lateral boundary of the collector well region 118. In this regard, the lateral distance (spacing Spr, Sp, of the intermediate portions 156, 157, respectively) between a lateral boundary of a respective P-well region 144, 154 and the proximal lateral boundary of the collector well region 118 corresponds to the steady state (or DC) avalanche breakdown voltage for that respective bipolar transistor element. In one or more exemplary embodiments, the lateral separation distance (spacing Spr, Sp) between a lateral boundary of a respective P-well region 144, 154 and the proximal lateral boundary of the collector well region 118 is less than ten microns. In some embodiments, a respective P-well region 144, 154 may abut the collector well region 118.

During an ESD event when a higher transient voltage is applied at terminal 12, 184 relative to terminal 14, 186, the base-collector junction of the first transistor 192 (BJT 22) (e.g., between base regions 144, 176 and common collector regions 108, 118) is forward-biased, thereby raising the electrical potential of the common collector region 108, 118. The collector potential increases until the avalanche breakdown occurs across the collector-base junction of the second transistor 193 (BJT 23). It should be noted that the steady state (or DC) avalanche breakdown voltage of the collector-base junction of the second transistor 193 (BJT 23) is dictated by the distance (Sp) between the triggering base well region 154 and the collector well region 118 (or alternatively, the length (Sp) of the intermediate portion 157 of the lower conductivity epitaxial layer 114 residing between the triggering base well region 154 and the collector well region 118).

The triggering well region 154 in the second transistor region 103 is spaced apart from the collector (DPN) region 118 by a distance (Sp) that defines the breakdown voltage of the second transistor 193 (BJT 23). The distance (Sp) between the lateral boundary of the triggering base well region 154 and the collector region 118 (i.e., intermediate portion 157) can be varied to increase and/or decrease the forward DC breakdown voltage ($V_{TDC}$) of the second transistor 193 (BJT 23). For example, in one embodiment, a distance Sp=0 results in a forward DC breakdown voltage ($V_{TDC}$) of about 19V while a distance Sp=3.5 microns results in a forward DC breakdown voltage ($V_{TDC}$) of about 55V. In this regard, increasing the separation distance (Sp) increases the breakdown voltages of the second transistor 193 (BJT 23), while decreasing the separation distance (Sp) decreases the breakdown voltages of the second transistor 193 (BJT 23).

Figure 10:
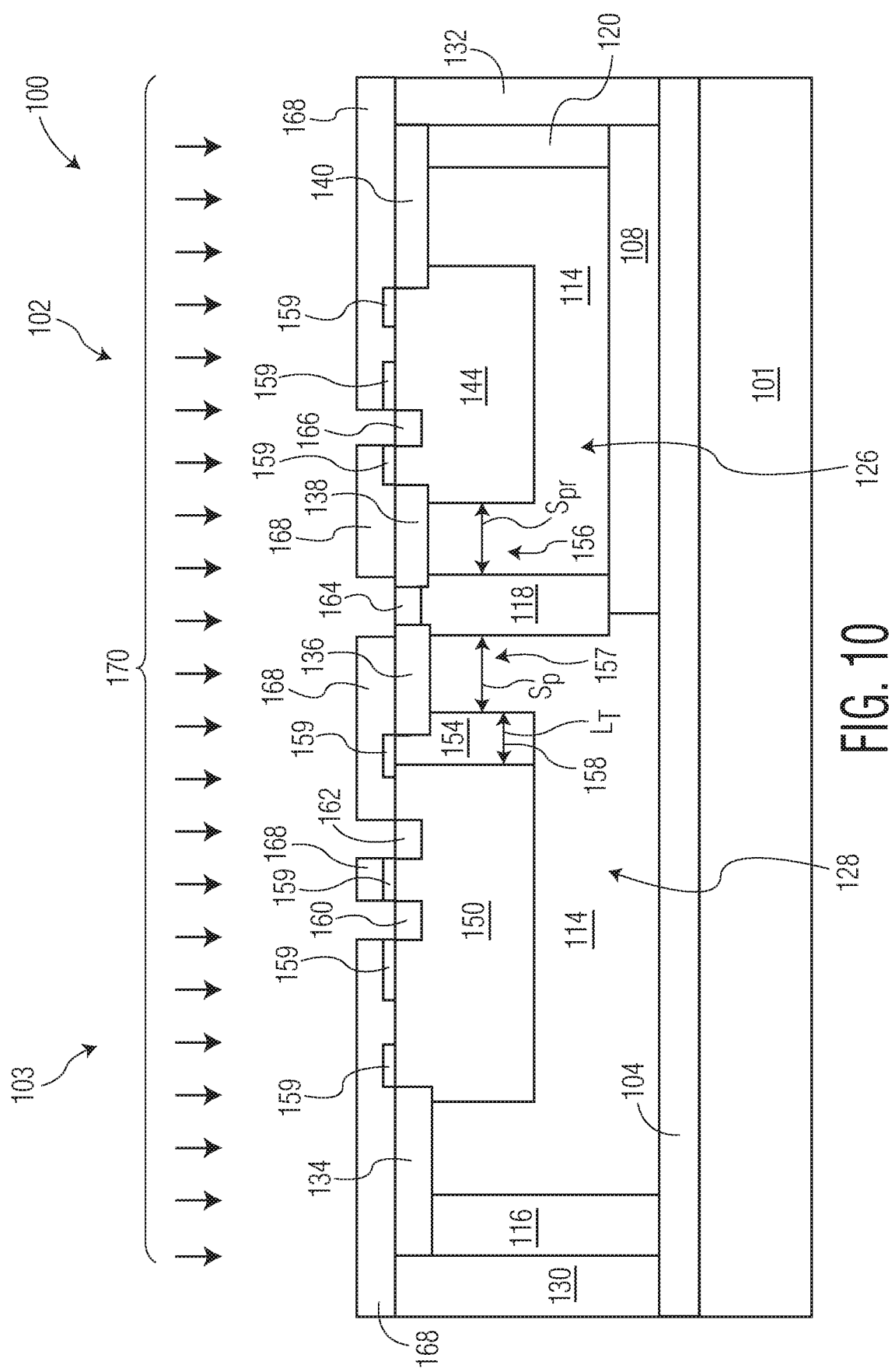
FIG. 10 illustrates a cross-sectional view of the ESD protection device of FIG. 9 at a subsequent processing stage in accordance with an embodiment of the invention.
Figure 11:
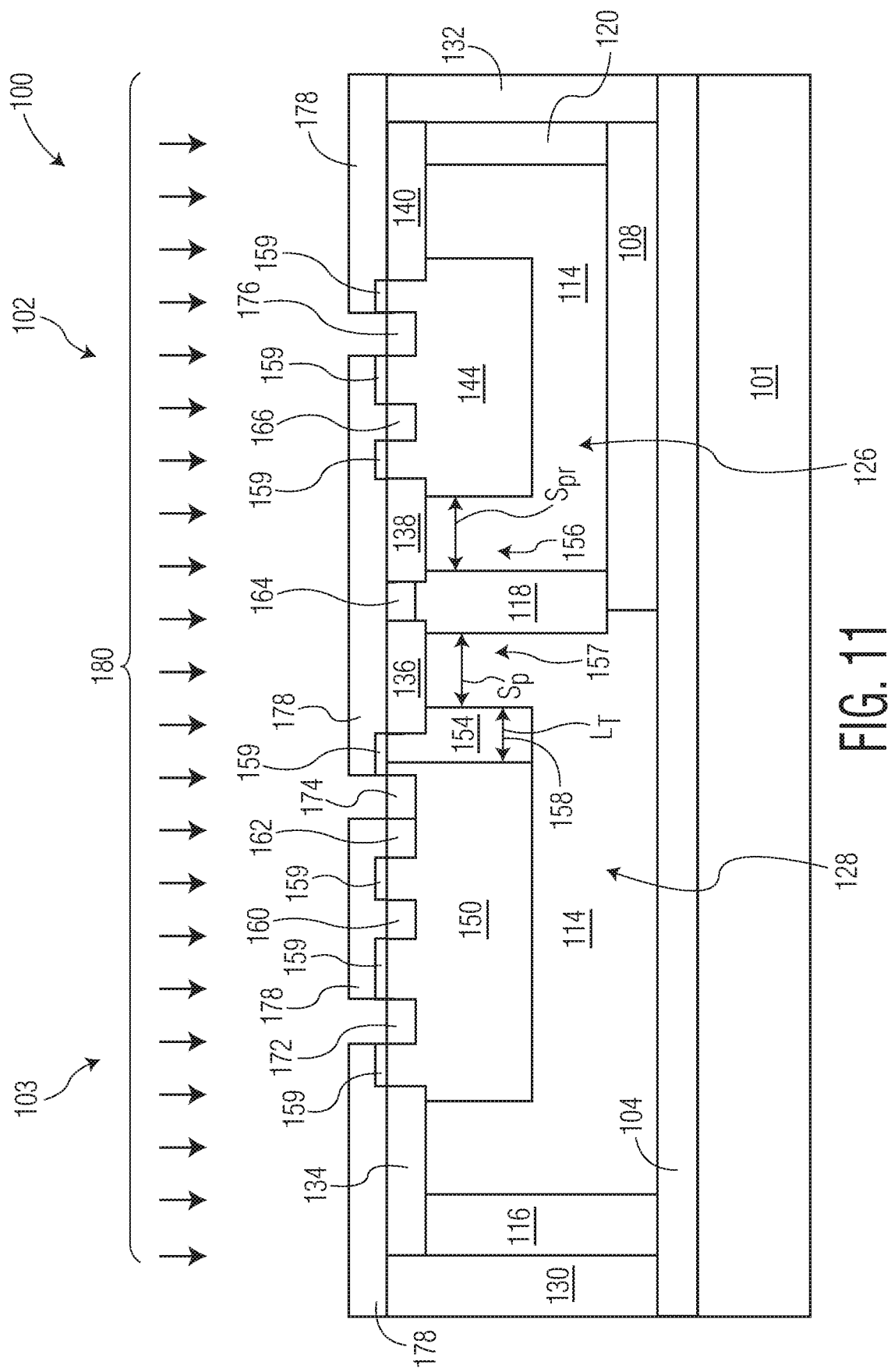
FIG. 11 illustrates a cross-sectional view of the ESD protection device of FIG. 10 at a subsequent processing stage in accordance with an embodiment of the invention.

Referring to FIG. 10-11, to achieve increased holding voltage (Vh), the highly doped base well region 150 of the second transistor 193 (BJT 23) includes electrically connected shallow N-type and P-type doped regions 162, 174 formed therein and at a floating electrical potential to reduce the current gain of the second transistor 193 (BJT 23). The doped regions 162, 174 are floating in that they are not directly connected to any device terminals 184, 186 or any other external circuitry that could ground or otherwise influence the electrical potential of the doped regions 162, 174. The floating doped regions 162, 174 are disposed laterally between the shallow N-type doped emitter region 160 and the P-doped triggering region 154. The floating doped regions 162, 174 have opposite conductivity with respect to one another and are short-circuited or otherwise electrically connected together without any intervening external circuit elements so that they have substantially the same electrical potential. In exemplary embodiments, the floating doped regions 162, 174 abut or are otherwise in contact each other. For an NPN device, the P-type floating region 174 resides laterally between the floating N-type region 162 and the P-doped triggering region 154. The floating N-type region 162 resides laterally between the emitter region 160 and the floating P-type region 174 to collect electrons that would otherwise flow between the emitter region 160 and the collector well region 118 during an ESD event after the second transistor 193 (BJT 23) triggers or turns on by avalanche breakdown. The P-type floating region 174 resides laterally between the floating N-type region 162 and the collector well region 118, and supplies holes that recombine with the electrons collected by N-type floating region 162 by virtue of the floating regions 162, 174 being electrically connected. In this manner, the floating regions 162, 174 are configured to cooperatively provide a current path to reduce the current gain (ß) of the second transistor 193 (BJT 23) after it is triggered (or turned on). By reducing the current gain, the holding voltage (Vh) of the second transistor 193 (BJT 23) is increased, which, in turn, increases the holding voltage (Vh) of the protection circuitry 18 and/or the protection device structure 100. It will be appreciated that a higher holding voltage (Vh) reduces latch up susceptibility (e.g., by increasing the difference between the holding voltage and the supply (or operating) voltage and providing greater margin for manufacturing variations and the like). Although not illustrated, in some embodiments, the high conductivity base well region 144 of the first transistor 192 (BJT 23) may also include electrically connected floating regions formed therein to increase the holding voltage in the reverse direction.

Referring to FIG. 10, in exemplary embodiments, prior to forming shallow N-type and P-type contact regions and floating N-type and P-type doped (tie) regions, the fabrication process continues by forming spaced apart silicide blocking regions 159 overlying the P-well regions 144, 150, 154. In this regard, the silicide blocking regions 159 prevent subsequent formation of silicide material on the portions of the P-well regions 144, 150, 154 between neighboring shallow contact regions and the floating doped regions. The silicide blocking regions 159 include one or more silicide blocking materials, such as, one or more oxide materials and/or one or more nitride materials. For example, in one embodiment, the silicide blocking regions 159 are formed by forming a layer of oxide material (which may function as a gate dielectric for other devices on the wafer), forming a layer of nitride material overlying the oxide material, and etching the oxide and nitride materials to expose the portions of the P-well regions 144, 150, 154 to be used for the shallow contact regions while the remaining silicide blocking material overlying the P-well regions 144, 150, 154 remains intact.

Referring again to FIG. 10, after forming the silicide blocking regions 159, shallow N-type contact regions 160, 164, 166 and floating N-type doped region 162, are formed within the highly doped P-well base region 150 in transistor region 103, the deep N-type collector well region 118, and the P-well base region 144 in transistor region 102 The shallow N-type contact regions 160, 164, 166 and floating N-type doped region 162 are formed by masking the ESD protection device structure 100 with a masking material 168 that is patterned to expose the P-well regions 144, 150 and the central portion of the deep N-type well region 118 between shallow isolation regions 136, 138, as illustrated by FIG. 10. The shallow contact regions 160, 164, 166 and floating doped region 162 are then formed by implanting N-type ions, such as phosphorous ions or arsenic ions, illustrated by arrows 170, in the exposed portions of the regions 118, 150, 144 with a dopant concentration in the range of about $5 \times 10^{19}/cm^3$ to about $1 \times 10^{21}/cm^3$ to provide the shallow N-type regions 160, 162, 164, 166 with a depth (after diffusion) that is less than a depth of the shallow isolation regions 134, 136, 138, 140. For example, in accordance with one or more embodiments, the depth of the shallow N-type regions 160, 162, 164, 166 is in the range of about 0.05 microns to about 0.3 microns. In the illustrated embodiment, each emitter contact region 160, 166 is formed or otherwise resides within a respective higher conductivity base well region 150, 144 such that the respective base well region 150, 144 encompasses, surrounds and/or abuts the respective emitter contact region 160, 166. Additionally, in the illustrated embodiment, the floating N-type doped region 162 is formed or otherwise resides within the highly doped (higher conductivity) base well region 150, which encompasses, surrounds and/or abuts the floating N-type doped region 162.

Referring to FIG. 11, in a similar manner, the shallow P-type contact regions 172, 176, and floating P-type doped region 174 are formed by masking the ESD protection device structure 100 with a masking material 178 that is patterned to expose portions of the highly doped P-well base region 150 in transistor region 103 and portions of the P-well base region 144 in transistor region 102. After the masking material 178 is patterned, the shallow P-type regions 172, 174, 176 are formed by implanting P-type ions, such as boron ions, illustrated by arrows 180, in the exposed portions of the highly doped P-well base region 150 in transistor region 103 and the P-well base region 144 in transistor region 102 with a dopant concentration in the range of about $5 \times 10^{19}/cm^3$ to about $1 \times 10^{21}/cm^3$ and to provide the shallow P-type regions 172, 174, 176 with a depth (after diffusion) that is less than a depth of the shallow isolation regions 134, 136, 138, 140 (e.g., in the range of about 0.05 microns to about 0.3 microns). In this regard, each of the base electrode contact regions 172, 176, and the floating P-typed doped region 174, are encompassed or otherwise surrounded by the respective P-well base region 150, 144.

Each of the N-type contact regions 160, 166 functions as a relatively higher doped emitter electrode for second transistor 193 (BJT 23) and first transistor 192 (BJT 22), respectively. N-type contact region 164 functions as a relatively higher doped collector electrode contact region for the shared collector well region 118 of the first and second transistors 192, 193 (BJTs 22, 23), and floating N-type doped region 162 functions cooperatively with floating P-type doped region 174 to reduce the current gain (ß) of the second transistor 193 (BJT 23). In this regard, as described above, the N-type emitter region 166, the P-type base regions 144, 176, and the N-type collector regions 108, 118 function as the first transistor 192 (BJT 22) of the protection circuitry 18, while the second N-type emitter region 160, the second P-type base regions 150, 154, 172 and the N-type collector regions 108, 118 function as the second transistor 193 (BJT 23) of the protection circuitry 18.

Turning now to FIG. 12, in embodiments, after forming the shallow N-type and P-type contact regions and the floating doped regions 162, 174, fabrication of the ESD protection device structure 100 can be completed by forming contacts 182 on the base electrode contact regions 172, 176 and the emitter electrode contact regions 160, 166, providing electrical connections between the respective base and emitter electrodes of the respective bipolar junction transistor elements, and providing electrical connections to/from the electrically connected base and emitter electrodes of the respective bipolar junction transistor elements and a respective physical interface terminal 184, 186 (12, 14 in FIG. 1) of the electronic device 10 that includes the protection device structure 100. The contacts 182 may be realized as a metal silicide layer formed by conformably depositing a layer of silicide-forming metal onto the exposed surfaces of the base electrode contact regions 172, 176 and the emitter electrode contact regions 160, 166 and heating the ESD protection device structure 100, for example by rapid thermal annealing (RTA), to react the silicide-forming metal with the exposed silicon and form the metal silicide layer as contacts 182 at the top of the electrode contact regions 160, 166, 172, 176 that are not masked by the silicide blocking regions 158.

In embodiments, after the contacts 182 are formed, the fabrication process continues by forming a layer of dielectric material 188 overlying the ESD protection device structure 100. The dielectric material 188 may be realized as an interlayer dielectric material, such as an oxide material, that is conformably deposited overlying the ESD protection device structure 100 in a conventional manner. Portions of the dielectric material 188 overlying the base electrode contact regions 172, 176 and the emitter electrode contact regions 160, 166 are removed to expose the contacts 182. The dielectric material 188 can be removed by etching the dielectric material 188 using an anisotropic etchant to provide voided regions overlying the base and emitter contacts 182.

In a next step, the contact regions 182 of the base and emitter contact regions 166, 176 of the first transistor 192 (BJT 22) can be tied together to form physical interface terminal 184, and the contact regions 182 of the base and emitter contact regions 160, 172 of the second transistor 192 (BJT 23) can then be tied together to form physical interface terminal 186, of the ESD protection device 100. In exemplary embodiments, a conductive material 190 is formed overlying the exposed base and emitter contacts 182 of the respective transistor 192, 193 (BJT 22, 23). The conductive material 190 can be formed in the voided regions by conformably depositing a metal material overlying the ESD protection device structure 100 to a thickness that is greater than or equal to the thickness of the dielectric material 188. As illustrated, the conductive material 190 can be patterned, routed, or otherwise formed to provide a direct electrical connection between the base and emitter electrode of a respective bipolar junction transistor (BJT) element 192, 193 (BJT 22, 23), thereby effectively short-circuiting the base and emitter of the bipolar junction transistor elements together. Additionally, the conductive material 190 is patterned, routed, or otherwise formed to provide an electrical connection between the electrode regions 160, 166, 172, 176 of a respective bipolar junction transistor (BJT) element and a respective physical interface terminal 184, 186 of the electronic device. In exemplary embodiments, the dielectric material 188 overlying the collector well contact 164 remains intact so that the collector regions 108, 116, 118, 120 are floating and not directly connected to any device terminals or any other external circuitry that could ground or otherwise influence the electrical potential of the common collector.

In some embodiments, contacts 182 are formed on the floating doped regions 162, 174, the dielectric material 188 is patterned to expose the contacts 182 overlying the floating doped regions 162, 174, and a conductive material 190 is formed to provide an electrical connection between the floating doped regions 162, 174.

Thus, with reference to FIG. 12, in an embodiment, the invention provides a semiconductor device comprising an ESD protection device structure 100 comprising: a base well region 150, 154 of semiconductor material having a first conductivity type, wherein the base well region 150, 154 includes a first region 150 and a second region 154, the first region 150 having a higher dopant concentration than the second region 154, and the second region 154 is disposed between the first region 150 and a collector region 118 of semiconductor material having the second conductivity type; an emitter region 160 of semiconductor material within the first region 150 of the base well region 150, 154, the emitter region 160 having a second conductivity type opposite the first conductivity type; a base contact region 172 of semiconductor material within the first region 150 of the base well region 150, 154, the base contact region 172 having the first conductivity type; a first floating region 162 of semiconductor material within the first region 150 of the base well region 150, 154, the first floating region 162 having the second conductivity type; and a second floating region 174 of semiconductor material within the first region 150 of the base well region 150, 154, the second floating region 174 having the first conductivity type, wherein: a portion of the first region 150 of the base well region 150, 154 is disposed between the emitter region 160 and the second region 154 of the base well region 150, 154; the first region 150 of the base well region 150, 154 has a dopant concentration that is greater than the second region 154 of the base well region 150, 154; the first floating region 162 is disposed between the emitter region 160 and the second floating region 174; the second floating region 174 is disposed between the first floating region 162 and the second region 154 of the base well region 150, 154; the first floating region 162 and the second floating region 174 are abutting and electrically connected; and the base contact region 172 and the emitter region 160 are electrically connected.

In the configuration shown in FIG. 12, with reference to FIG. 1, the protection circuitry 18 is realized as the ESD protection device structure 100, which includes two NPN bipolar junction transistors 192 and 193, having electrodes of the BJTs 22, 23 formed therein, in which a first transistor 192 (BJT 22) is formed in transistor region 102 and a second transistor 193 (BJT 23) in transistor region 103. In this regard, physical interface terminal 184 is realized as the supply voltage terminal 12 and physical interface terminal 186 is realized as ground voltage terminal 14. The second BJT 23 is comprised of N-type emitter region 160, P-type base regions 150, 172, and N-type collector regions 108, 118, and first BJT 22 is comprised of N-type emitter region 166, P-type base regions 144, 176, and N-type collector regions 108, 118.

To illustrate the location and electrical interconnection of transistors 192 and 193 within the device, FIG. 12 includes a dashed schematic overlay showing the approximate location of a number of transistor structures within device 100. In the overlay, first transistor 192 (BJT 22) is represented by transistor Q2 and second transistor 193 (BJT 23) is represented by transistor Q1. In FIG. 12, transistors Q1, Q2, Q3 (described below), and their interconnections are only included for reference and do not form any portion of the structure of device 100. In FIG. 12, shallow N-doped contact region 166 and P-doped contact region 176 serve, respectively, as the emitter and base of the first transistor 192 (BJT 22). N-doped contact region 160 and P-doped contact region 172 serve, respectively, as the emitter and base of the second transistor 193 (BJT 23). The N-well region 118 (and connected NBL region 108) serves as the shared collector of transistors 192 and 193. The contacts 182 of the emitter and base contact regions 166, 176 of the first transistor 192 are tied together to form physical interface terminal 184 for ESD protection device 100. The contacts 182 of the emitter and base contact regions 160, 172 of the second transistor 193 are tied together to form physical interface terminal 186 for ESD protection device 100. In this configuration, a parasitic PNP transistor structure is formed in device 100 at the approximate location of transistor Q3 in FIG. 12. Deep N-well region 118 and the adjoining NBL region 108 serve as the base of the transistor structure Q3, and P-well regions 144, 150 serve as the emitter and collector of transistor structure Q3. Deep N-well region 118 also serves as a collector of both the first transistor 192 and the second transistor 193. In the present device, NBL 108 formed under the first transistor 192 enables the operation of the parasitic PNP transistor structure Q3.

During a forward ESD event, when a positive voltage is applied to terminal 184 with respect to terminal 186, the first transistor 192 acts as a forward-biased diode, and the base-collector junction of the second transistor 193 is reverse biased. When a sufficiently large voltage is applied to terminal 184 with respect to terminal 186, intermediate portion 157 of epitaxial region 114 in the second transistor region 103 becomes depleted of free carriers. As the applied voltage increases to Vt1, avalanche breakdown occurs across the base-collector spacing in intermediate portion 157 of the second transistor region 103. Thus, the (forward) triggering voltage Vt1 at which avalanche breakdown occurs in transistor 193 can depend upon the base-collector spacing between the triggering P-well region 154 and the collector N-well region 118 within second transistor 193; the larger the spacing, the higher Vt1 and, conversely, the smaller the spacing, the smaller Vt1. As the applied voltage increases above Vt1, the avalanche breakdown generates carriers turning on second (NPN) transistor 193 (Q1). The second (NPN) transistor 193 (Q1) then couples with PNP transistor structure Q3 so that the base of the second transistor 193 (Q1) also serves as and connects to the collector region of transistor structure Q3, and the collector region of the second transistor 193 (Q1) serves as and connects to the base of transistor structure Q3. The coupling between the second transistor 193 and transistor structure Q3 forms a parasitic silicon controlled rectifier (SCR). The parasitic SCR effects provide strong current capability for the device after the device snaps back and begins conducting.

Conversely, during a reverse ESD event, when a negative voltage is applied to terminal 184 with respect to terminal 186, the second transistor 193 acts as a forward-biased diode and the base-collector junction of transistor 193 is reverse biased. When a positive voltage with sufficiently large amplitude is applied to terminal 186 with respect to terminal 184, intermediate portion 156 of epitaxial region 114 in transistor region 103 becomes depleted of free carriers. As the applied voltage increases to $Vt1_R$, avalanche breakdown occurs across the base-collector spacing in portion 156 of epitaxial region 114 in transistor region 102. Thus, the reverse triggering voltage $Vt1_R$ at which avalanche breakdown occurs in the first transistor 192 can depend upon the base-collector spacing between P-well 144 and N-well 118 within first transistor 192; the larger the spacing, the higher $Vt1_R$ and, conversely, the smaller the spacing, the smaller $Vt1_R$. As the applied voltage increases above $Vt1_R$, the avalanche breakdown generates carriers to turn on the first (NPN) transistor 192 (Q2). The first (NPN) transistor 192 (Q2) then couples with PNP transistor structure Q3 in a way that the base of transistor 192 (Q2) also serves as and connects to the collector region of transistor structure Q3, and the collector region of the first transistor 192 (Q2) serves as and connects to the base of Q3. The coupling between first transistor 192 and transistor structure Q3 also forms a parasitic SCR. The parasitic SCR effects provide strong reverse current capability for the device after the device snaps back and begins conducting.

The forward and reverse triggering voltages Vt1 and $Vt1_R$ may be substantially the same or different depending on whether the base-collector spacings (Sp, Spr) in intermediate portions 156, 157 are substantially the same or different.

In the arrangement shown in FIG. 12, the second transistor 193 controls the forward triggering of ESD protection device 100 during a forward ESD event. The parasitic SCR formed by second transistor 193 and transistor structure Q3 controls the forward holding voltage of ESD protection device 100 after the applied voltage exceeds Vt1 for the device (and so the device begins to snapback and conduct current). First transistor 192 controls the reverse triggering of ESD protection device 100 during a reverse ESD event. The parasitic SCR formed by first transistor 192 and transistor structure Q3 controls the reverse holding voltage of ESD protection device 100 after the applied voltage exceeds $Vt1_R$ for the device (and the device begins to snapback and conduct current).

In a conventional dual-polarity ESD protection device having a full, uniformly implanted NBL, a substantial amount of current flows through the NBL that is located under each transistor. However, in the ESD device 100 illustrated in FIG. 12, NBL 108 is present only under first transistor 192. As a result, after the device is triggered, relatively little current flows through NBL 108 for the second transistor 193. This behavior increases the forward holding voltage, Vh, of the device, improving its performance for a forward ESD event. Forward and reverse operations can be symmetrical.

Figure 13:
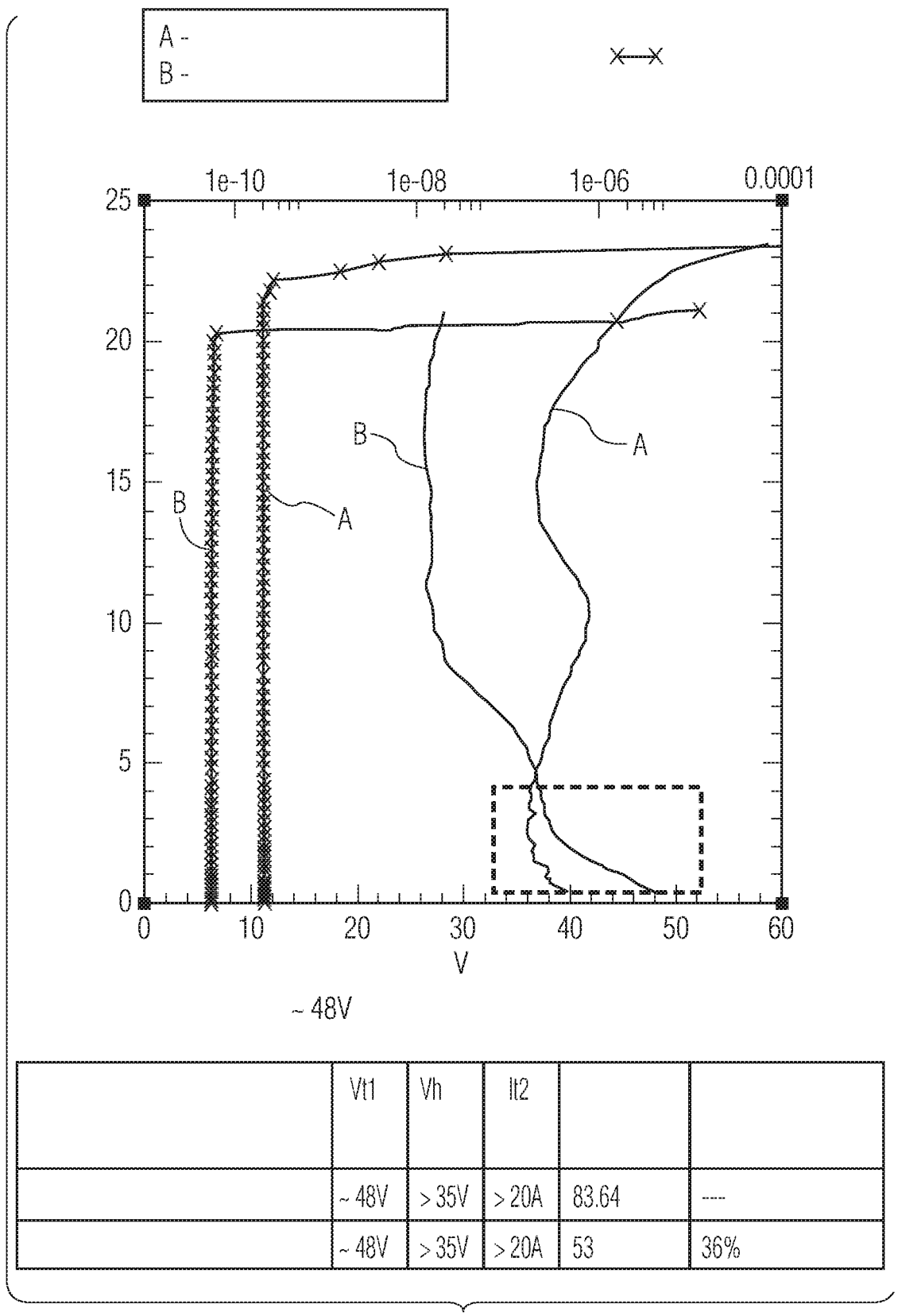
FIGS. 13-14 show graphs and a table with experimental results pertaining to two different ESD protection devices.
Figure 14:
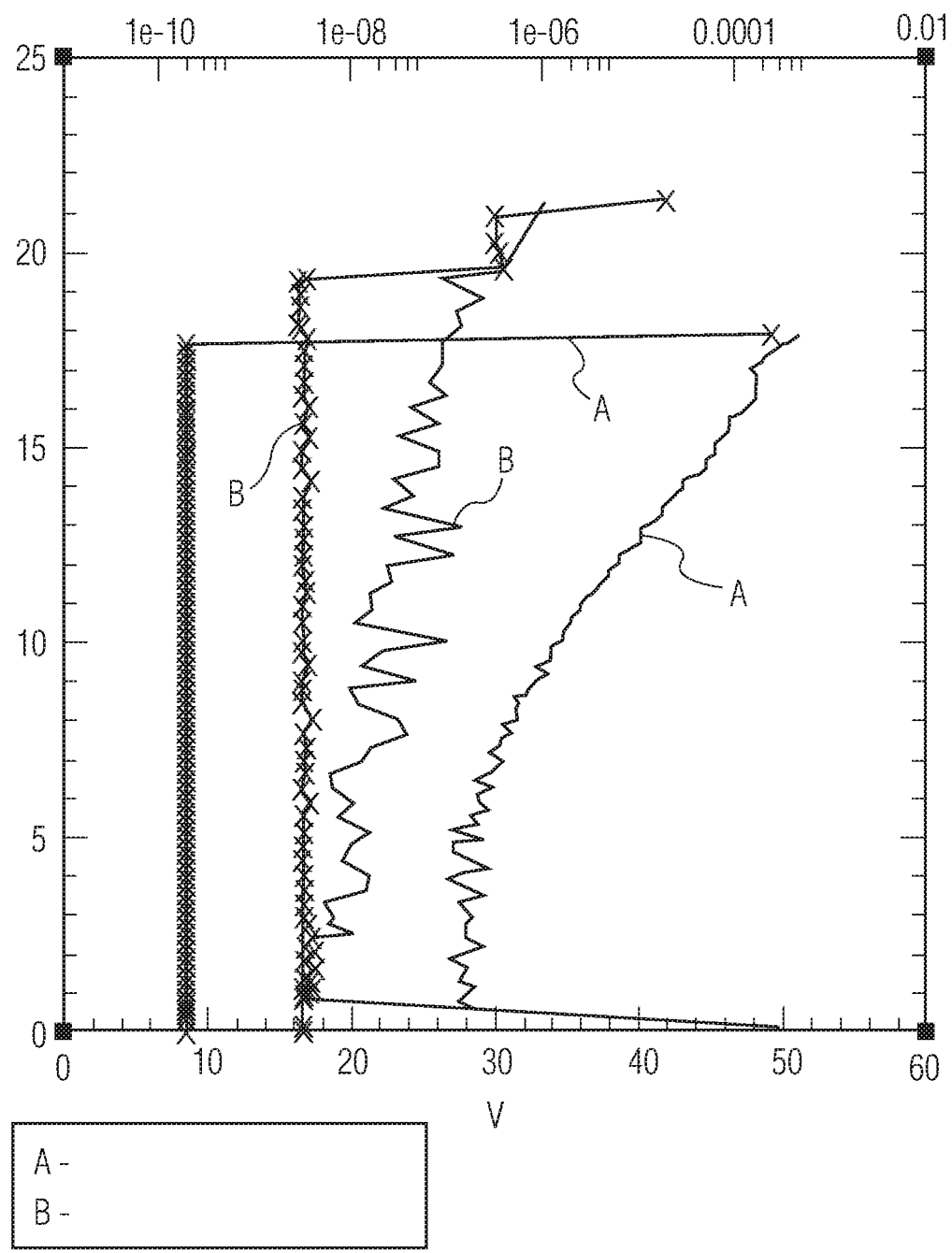

FIGS. 13-14 show diagrams of Transmission Line Pulse (TLP) data with current-vs-voltage (I-V) graphs for two different In +40V/−40V ESD protection devices (clamps), along with a Table indicating the holding voltage Vh, the triggering voltage Vt1, and the current capability It2 determined from the graphs, and the width (footprint) of each device. Graph A refers to a +40V/−40V ESD protection device structured similar to ESD protection device 400 disclosed in FIG. 14 of U.S. Pat. No. 9,287,255 as a 1-stack NPNB with floating P-tie (450) connected in series as a 2-stack configuration. In brief, each stack 400 included two transistors (320, 322), each having a higher conductivity base well region (344, 346) surrounding an emitter and disposed between an adjacent lower conductivity base well region (340, 342) surrounding a base electrode contact and a triggering base well region (336, 338) spaced apart from a collector well (316), an NBL layer (308) present in the first transistor (320) but absent from the second transistor (322), and a floating P-type doped region (450) within the triggering base well region (336) in the second transistor (322)

between the emitter (350) and the collector well (316). Graph B refers to a +40V/−40V ESD protection device according to the invention as a single 1-stack NPNB with first and second transistors, the second transistor including a superimposed, highly doped (highly conductive, lower resistivity) base well region surrounding an emitter region and an electrically floating N- and P-type doped tie region, a relatively lower conductivity (higher resistivity) doped triggering base well region between the highly doped base well region and a collector region, and no underlying NBL layer.

The TLP data of the two 40V ESD clamps showed a similar or higher Vh for the inventive 1-stack ESD protection device compared to the prior art 2-stack ESD protection device. The data also showed similar ESD robustness (It2) for system-level ESD protection. In addition, the inventive 1-stack ESD protection device demonstrated a 36% footprint savings, with the prior art 2-stack ESD clamp requiring the two devices connected in series in order to meet >35V Vh and a much larger footprint (83.64 µm width) that the present ESD protection device (53 µm width).

FIGS. 15-19 illustrate, in cross-section, another embodiment of an ESD protection device structure 200 suitable for use as the protection circuitry 18 in an electronic device in accordance with one or more exemplary embodiments. As shown, the ESD protection structure 200 includes the same components as ESD protection structure 100 except for the formation and structure of buried doped layer (NBL) 208.

Figure 15:
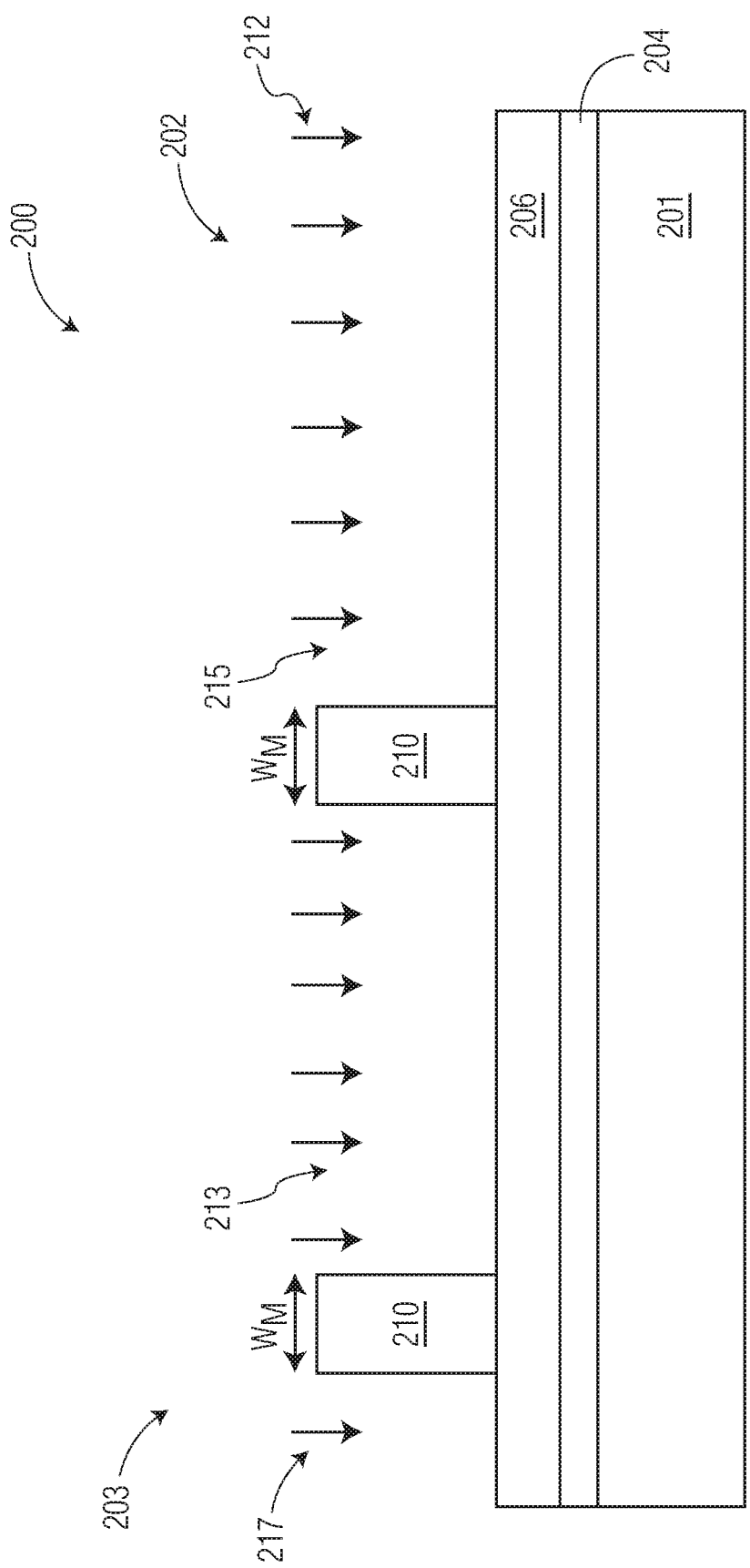
FIG. 15 illustrates a cross-sectional view of an ESD protection device implemented in a semiconductor substrate at a processing stage in accordance with another embodiment of the invention.

Referring to FIG. 15, a semiconductor layer 206 is formed over BOX layer 204, as described with reference to FIG. 3. In masking the semiconductor layer 206 to form the buried doped layer (NBL) 208, a ring-shaped masking layer 210 is formed over semiconductor layer 206 and includes openings 213, 215, 217. In an embodiment, ring-shaped masking layer 210 is formed by forming a layer of a masking material, such as a photoresist material, over semiconductor layer 206 and then patterning the masking layer to form openings 213, 215, 217. Ring-shaped masking layer 210 covers a ring-shaped region of semiconductor layer 206 in the second transistor region 203. The ring-shaped masking layer 210 has openings 213 and 217 over semiconductor layer 206 in the second transistor region 203 and an opening 215 over semiconductor layer 206 in the first transistor region 202. An implant, illustrated by arrows 212 is then injected or diffused into semiconductor layer 206 via the openings 213, 215, 217 to form doped regions within semiconductor layer 206 as defined by openings 213, 215, 217. Implant 212 enters exposed regions of the semiconductor layer 206 and is blocked from entering semiconductor layer 206 in those regions covered by the masking layer 210.

Figure 16:
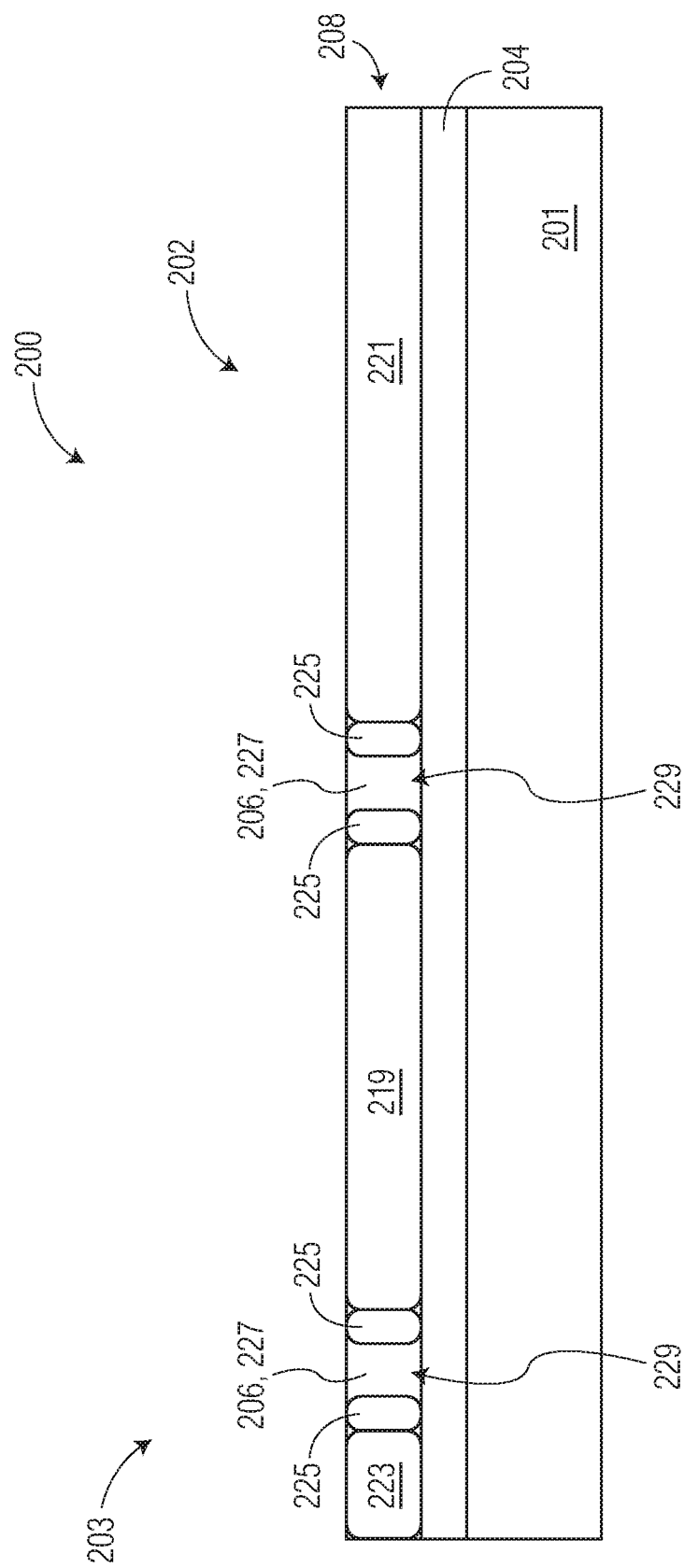
FIG. 16 illustrates a cross-sectional view of the ESD protection device of FIG. 15 at a subsequent processing stage in accordance with an embodiment of the invention.

FIG. 16 illustrates ESD protection device 200 at a subsequent stage in processing, after removal of the ring-shaped masking layer 210. Implant 212 into semiconductor layer 206 results in highly doped regions 219, 221, 223, which are aligned to the openings in ring-shaped masking layer 210, such as openings 213, 215, 217. After implant 212, dopants may laterally diffuse from the highly doped regions by about, e.g., 0.5 to 2 um laterally, resulting in a laterally diffused region 225 around the highly doped regions 219, 221, 223. Laterally diffused region 225 has a lower dopant concentration than the highly doped regions 219, 221, 223. For example, the highly doped regions 219, 221, 223 may have a dopant concentration of about $1\times10^{16}$ cm$^{-3}$ to about $1\times10^{19}$ cm$^{-3}$, while laterally diffused region 225 may have dopant concentration of about $5\times10^{15}$ cm$^{-3}$ to about $1\times10^{18}$ cm$^{-3}$.

Doped regions 219, 221, 223 and laterally diffused region 225 form an N-type buried layer (NBL) 208. Due to ring-shaped masking layer 210, NBL 208 is formed throughout in first transistor region 202 but only partly in second transistor region 203. In second transistor region 203, semiconductor layer 206 includes a ring-shaped undoped region 227 (ring region) resulting from ring-shaped masking layer 210. Therefore, NBL 208 may be described as having an opening or gap 229 between doped region 219 and doped region 221, 223 in second transistor region 203 in which an undoped portion 227 (ring region) of semiconductor layer 206 is in direct contact with BOX layer 204. In first transistor region 202, NBL 208 provides a continuous doped layer underlying the region. The undoped region 227 (ring region) in semiconductor layer 206 allows for NBL 208 to have an increased electrical resistance.

In alternate embodiments, a P-type buried layer, similar to NBL 208, may be formed in which implant 212 is performed using a P-type dopant and ring-shaped masking layer 201.

Figure 17:
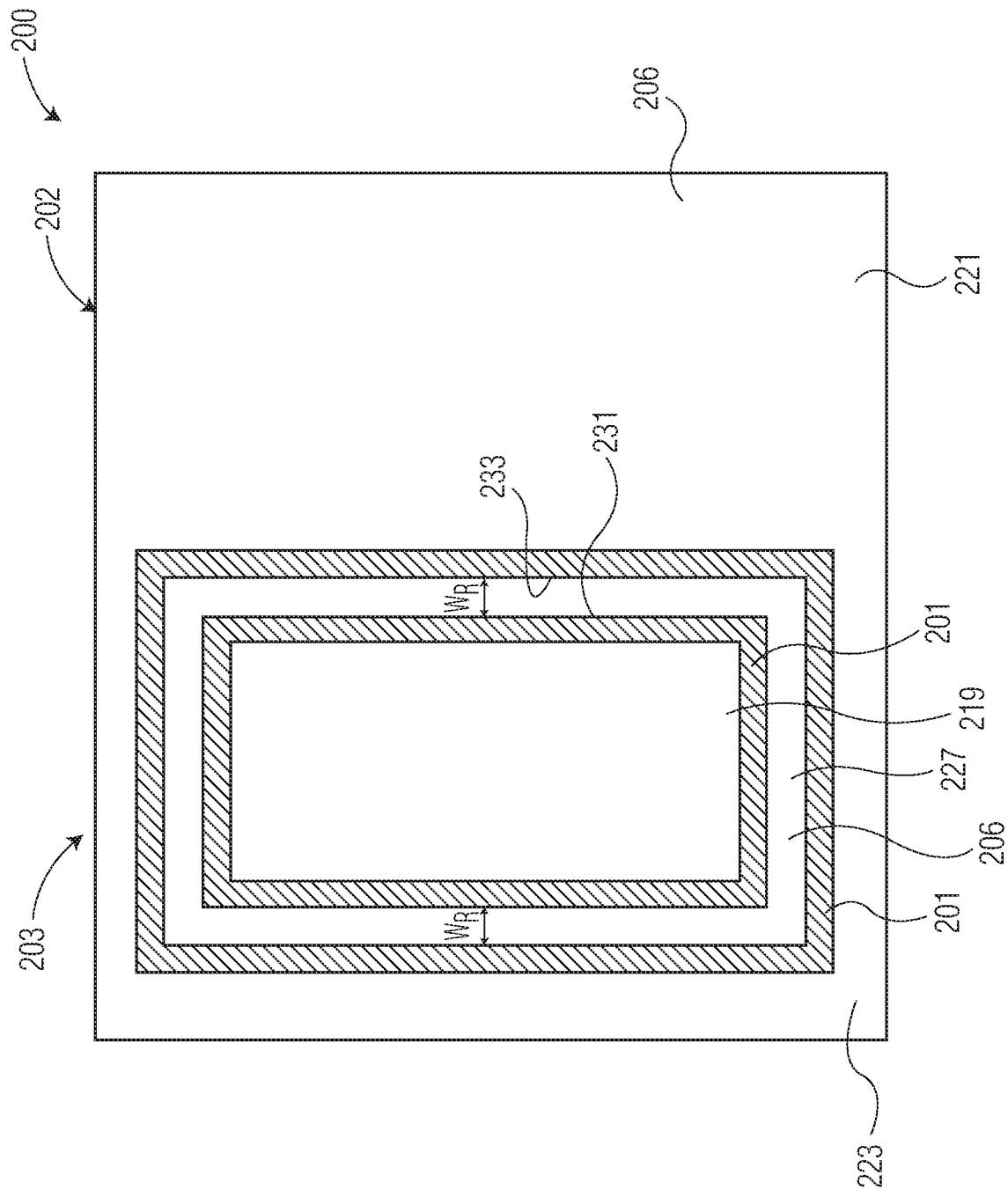
FIG. 17 illustrates a top down view of a portion of the ESD protection device of FIG. 16 in accordance with an embodiment of the invention.

FIG. 17 illustrates a top down view of a portion of ESD protection device 200 of FIG. 16 in accordance with various embodiments. Openings 213, 215, 217 (shown in FIG. 15) of ring-shaped masking layer 210, which define the highly doped regions 219, 221, 223, include an inner opening 213 and outer openings 215, 217. Outer openings 215, 217 are mutually connected and constitute a single outer opening 215, 217 separate from and surrounding the inner opening 213. For example, inner opening 213 may be rectangular to result in a rectangular-shaped doped region 219, as illustrated in FIG. 17.

The ring-shaped masking layer 210 results in a highly doped region 219, 221, 223, which includes an outer region 221, 223 and an inner region 219. Outer region 221, 223 includes a main region 221 located in first transistor region 202 and an edge region 223 located in second transistor region 203. Inner region 219 is located as an isolated island within outer region 221, 223. Inner region 219 is surrounded by ring region 227 which separates inner region 219 from outer region 221, 223. Ring region 227 is a ring-shaped, undoped region of semiconductor layer 106. In the illustrated example, ring region 227 is the only undoped region of semiconductor layer 106.

Undoped ring region 227 has a width WR, which may be either constant or variable to some extent along the inner or outer circumference 231, 233 of ring region 227. In an embodiment, the width WR is substantially constant. In another embodiment, the width WR denotes an average width of the ring region 227, e.g., as measured at multiple locations along the inner or outer circumference of the ring region 227, and then averaged. The inner circumference 331 of undoped ring region 227 is the outer circumference of inner doped region 219. The outer circumference 233 of ring region 227 is the inner circumference of outer region 221, 223. In an embodiment the width WR of ring region 227 is greater than or equal to (≥) 0.5 µm and equal to or less than (≤) 9.0 µm (e.g., 0.5 µm≤$W_R$≤9.0 µm).

Referring to FIG. 15, the ring-shaped masking layer 210 has a width $W_M$, which determines the resulting width $W_R$ of the ring region 227. In embodiments, the width $W_R$ of the ring region 227 can range from 0 µm to 10 µm. In one embodiment, the width $W_M$ of ring-shaped masking layer 210 is sufficiently large to prevent lateral diffusion between adjacent highly doped regions to overlap, so as to provide ring region 227 within NBL 208 as illustrated in FIGS. 16-17. As such, ring region 227 provides an undoped gap 229 between doped region 219 and doped region 221, 223. In one such embodiment, the width $W_M$ of ring-shaped masking layer 210 is at least 0.5 µm. In another embodiment, the width $W_M$ is small (e.g., less than 0.5 µm) such that the lateral diffusion between adjacent highly doped regions meets or overlaps resulting in a lightly doped ring region consisting of laterally diffused region 225. Laterally diffused region 225 may be referred to as lightly doped ring region 227 in the case where there is no undoped gap 229 between doped region 219 and doped region 221, 223.

Figure 18:
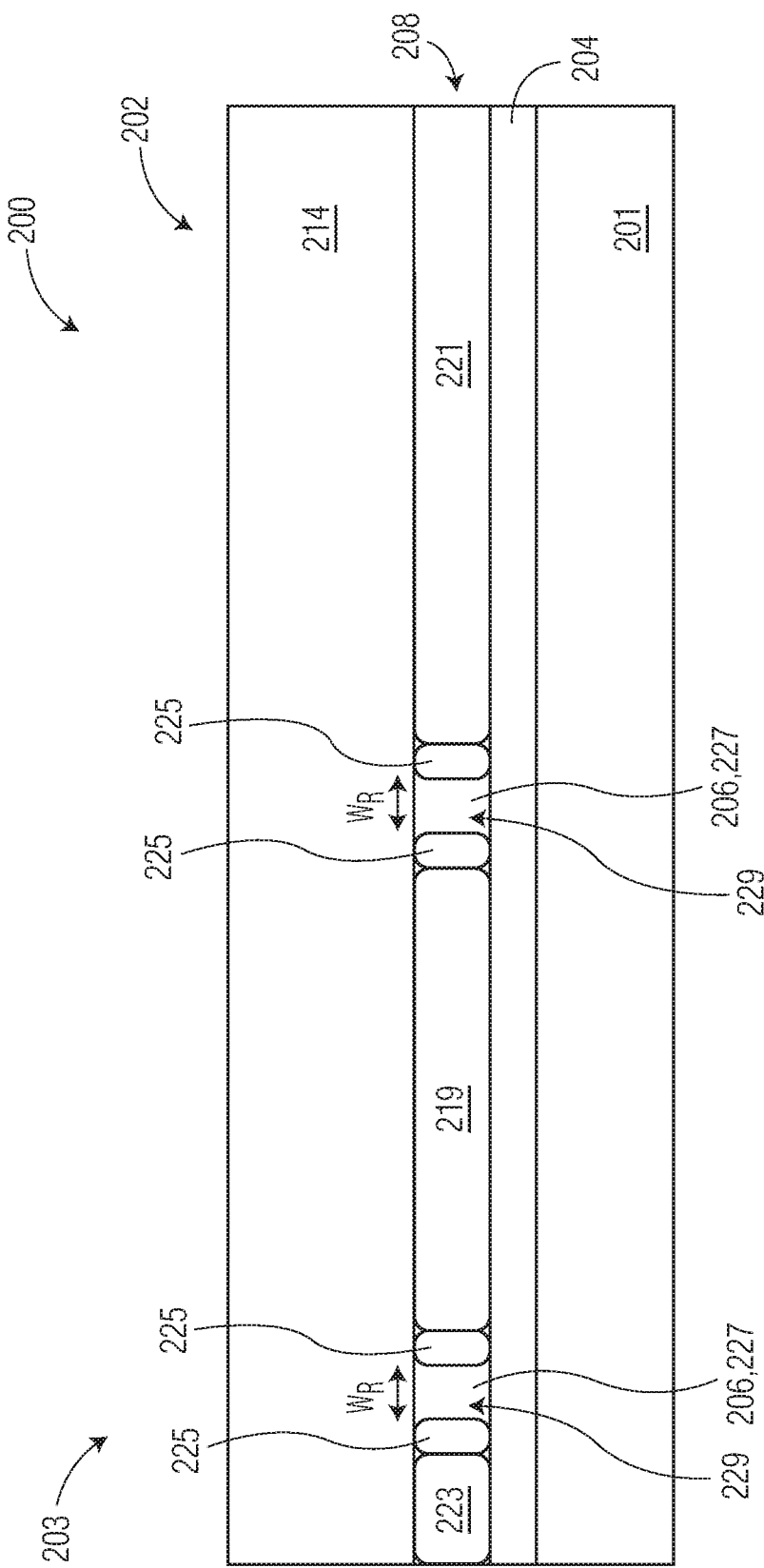
FIG. 18 illustrates a cross-sectional view of the ESD protection device of FIG. 17 at a subsequent processing stage in accordance with an embodiment of the invention.

FIG. 18 illustrates ESD protection device 200 at a subsequent stage in processing. After formation of the doped regions 219, 221, 223 in semiconductor layer 206 to form NBL 208, masking layer 210 is removed and a doped semiconductor layer 214 is formed over semiconductor layer 206 and NBL 208, as described with reference to FIG. 5, resulting in the ESD protection device structure 200 illustrated in FIG. 18. In an embodiment, doped semiconductor layer 214 is formed by epitaxial deposition of silicon and may be either N-type or P-type doped.

As shown in FIG. 18, NBL 208 is not continuous through ESD protection device 200. Instead, NBL 208, once formed, defines the ring region 227. That is, ring region 227 is located within an opening or gap 229 (FIG. 18) between doped inner region 219 and doped outer region 221, 223 of NBL 208 in second transistor region 203. As such, NBL 208 does not form a continuous layer of N-type material formed across the surface of BOX layer 204. NBL 208 is continuous in first transistor region 202 but not in second transistor region 203. The combination of semiconductor layer 214 and the portions of semiconductor layer 206 which do not include NBL 208 (such as the portion of semiconductor layer 206 in ring region 227) may be referred to as a semiconductor region 235 (see FIG. 19). As such, semiconductor region 235 is formed over NBL 208 and BOX layer 204. By virtue of ring region 227, semiconductor region 235 comes into contact with BOX layer 204.

As mentioned above, the gap 229 between doped inner region 219 and doped outer region 221, 223 of NBL 208 can be small enough to allow the NBL lateral diffusions to meet in the middle to form a lighter doping NBL extension, e.g., in the form of a laterally diffused region 235 which will be ring-shaped. Laterally diffused region 235 may replace ring region 227 without qualitatively changing the operating characteristics of ESD protection device 200.

Figure 19:
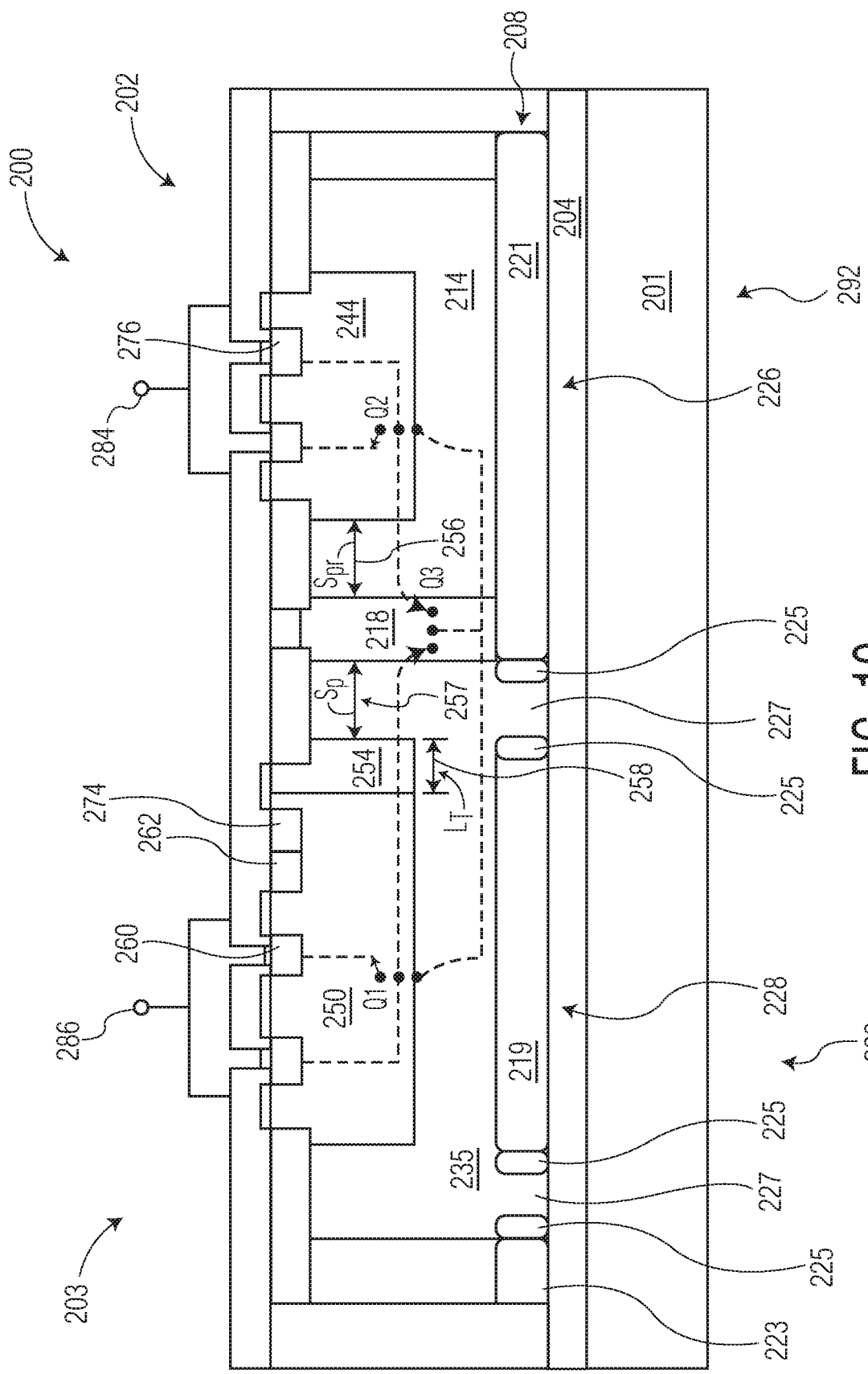
FIG. 19 illustrates a cross-sectional view of the ESD protection device of FIG. 18 at a subsequent processing stage in accordance with an embodiment of the invention.

Processing can then continue as described with regard to FIGS. 6-12 to produce ESD protection device 200, as illustrated in FIG. 19. ESD protection device is generally similar to ESD protection device 100 from FIG. 12, except for the NBL layer 208, which is composed of inner region 219 surrounded by an undoped (or lightly doped) ring-shaped region 227, which is surrounded by a heavily doped outer region 221, 223. This embodiment can achieve similar high holding voltage Vh as the embodiment in FIG. 12. In ESD device 200, NBL 208 is either not present between inner region 219 and outer region 221, 223 (resulting in ring region 227 and laterally diffused region 225) or present between inner region 219 and outer region 221, 223 but only with a relatively low doping concentration (resulting in laterally diffused region 225 but not necessarily in ring region 227). As a result, after the device 200 is triggered, relatively little current flows through NBL 208 for transistor 293. This behavior increases the forward holding voltage, Vh, of the device, improving its performance for a forward ESD event.

For the sake of brevity, conventional techniques related to semiconductor and/or integrated circuit fabrication, ESD protection schemes, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

The foregoing detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background or the detailed description. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

The invention claimed is:

1. A semiconductor device, comprising:
a first region of semiconductor material having a first conductivity type;
a second region of semiconductor material partially overlapping the first region, the second region having a first conductivity type;
a third region of semiconductor material within the first region, the third region having a second conductivity type opposite the first conductivity type;
a fourth region of semiconductor material having the second conductivity type;
a fifth region of semiconductor material having the first conductivity type;
a sixth region of semiconductor material within the first region, the sixth region having the second conductivity type; and
a seventh region of semiconductor material within the first region, the seventh region having the first conductivity type;
wherein:
a portion of the first region is disposed between the third region and the second region;
the second region is disposed between the first region and the fourth region;

the first region has a dopant concentration that is greater than the second region;
the fifth region and the third region are electrically connected;
the sixth region and the seventh region are abutting and electrically connected, and disposed between the third region and the second region; and
the sixth region and the seventh region are floating.

2. The semiconductor device of claim 1, wherein
the first region comprises a first base well region;
the second region comprises a triggering base well region;
the third region comprises an emitter region;
the fourth region comprises a collector region; and
the fifth region comprises a base contact region.

3. The semiconductor device of claim 1, wherein:
the first region has a dopant concentration that is greater than or equal to 1e16, and
the second region has a dopant concentration that is less than or equal to 1e19.

4. The semiconductor device of claim 1, wherein the second region and the fourth region are spaced apart by a distance.

5. The semiconductor device of claim 1, further comprising:
an eighth region of semiconductor material having the first conductivity type, the eighth region underlying the first region and the second region, and overlying a buried region of semiconductor material having the second conductivity type;
wherein the eighth region has a dopant concentration that is less than the first region and the second region.

6. The semiconductor device of claim 5, wherein the buried region has an outer region and an inner region which are heavily doped regions of the second conductivity type, the inner region being surrounded by a ring region which is an undoped or lightly doped ring-shaped region and which is surrounded by the outer region.

7. The semiconductor device of claim 5, wherein a portion of the eighth region is disposed between the second region and the fourth region.

8. The semiconductor device of claim 1, wherein the sixth region and the seventh region are short-circuited together.

9. The semiconductor device of claim 1, wherein the second region and the fourth region are short-circuited together.

10. A protection device structure, comprising:
a first base well region of semiconductor material having a first conductivity type, wherein the first base well region includes a first region and a second region, the first region having a higher dopant concentration than the second region, and the second region is disposed between the first region and a collector region of semiconductor material having the second conductivity type;
a first emitter region of semiconductor material within the first region (150) of the first base well region, the first emitter region having a second conductivity type opposite the first conductivity type, wherein at least a portion of the first region of the first base well region is disposed between the first emitter region and the second region of the first base well region;
a first base contact region of semiconductor material within the first region of the first base well region, the first base contact region having the first conductivity type, wherein at least a portion of the first region of the first base well region is disposed between the first base contact region and the first emitter region, and the first emitter region is disposed between the first base contact region and the second region of the first base well region, and the first emitter region and the first base contact region are electrically connected;
a first floating region of semiconductor material within the first region of the first base well region, the first floating region having the second conductivity type, wherein the first floating region is disposed between the first emitter region and the second region of the first base well region; and
a second floating region of semiconductor material within the first region of the first base well region, the second floating region having the first conductivity type, wherein the second floating region is disposed between the first floating region and the second region of the first base well region, and the first floating region and the second floating region are electrically connected;
a second base well region of semiconductor material having the first conductivity type, the collector region being disposed between the second region of the first base well region and the second base well region;
a second emitter region of semiconductor material within the second base well region, the second emitter region having the second conductivity type; and
a second base contact region of semiconductor material within the second base well region, the second base contact region having the first conductivity type, wherein the second base contact region and the second emitter region are electrically connected;
wherein:
at least a portion of the second base well region is disposed between the second base contact region and the second emitter region; and
the second emitter region is disposed between the second base contact region and the collector region.

11. The protection device structure of claim 10, wherein the second region of the first base well region is spaced apart from the collector region.

12. The protection device structure of claim 10, further comprising:
a buried region of semiconductor material having the second conductivity type; and
a doped region of semiconductor material having the first conductivity type overlying and abutting the buried region;
wherein:
the doped region underlies and abuts the first base well region and the second base well region;
the doped region has a dopant concentration less than the first base well region; and
the buried region underlies the second base well region and abuts the collector region.

13. The protection device structure of claim 12, wherein the buried region has an outer region and an inner region which are heavily doped regions of the second conductivity type;
the inner region being surrounded by a ring region which is an undoped or lightly doped ring-shaped region and which is surrounded by the outer region; and
the inner region of the buried region underlies the first base well region and the outer region of the buried region underlies the second base well region.

14. The protection device structure of claim 12, wherein a portion of the doped region is disposed between the second region of the first base well region and the collector region.

15. A device including the protection device structure of claim 10, the device further comprising:

a first interface terminal coupled to the second base contact region;

a second interface terminal coupled to the first base contact region; and functional circuitry coupled to the first interface terminal and the second interface terminal.

16. The protection device structure of claim 10, wherein the first floating region and the second floating region are abutting.

* * * * *